United States Patent
Vohra

(10) Patent No.: US 11,692,825 B2
(45) Date of Patent: Jul. 4, 2023

(54) DRIVE AND SENSE STRESS RELIEF APPARATUS

(71) Applicant: Analog Devices, Inc., Wilmington, MA (US)

(72) Inventor: Gaurav Vohra, Sudbury, MA (US)

(73) Assignee: Analog Devices, Inc., Wilmington, MA (US)

( * ) Notice: Subject to any disclaimer, the term of this patent is extended or adjusted under 35 U.S.C. 154(b) by 92 days.

(21) Appl. No.: 17/341,258

(22) Filed: Jun. 7, 2021

(65) Prior Publication Data

US 2021/0381833 A1 Dec. 9, 2021

Related U.S. Application Data

(60) Provisional application No. 63/036,273, filed on Jun. 8, 2020.

(51) Int. Cl.
*G01C 19/5712* (2012.01)

(52) U.S. Cl.
CPC ................. *G01C 19/5712* (2013.01)

(58) Field of Classification Search
CPC .......... G01C 19/5712; G01C 19/574
See application file for complete search history.

(56) References Cited

U.S. PATENT DOCUMENTS

| | | | |
|---|---|---|---|
| 5,016,072 A | 5/1991 | Greiff | |
| 5,241,861 A | 9/1993 | Hulsing, II | |
| 5,392,650 A | 2/1995 | O'Brien et al. | |
| 5,490,420 A | 2/1996 | Burdess | |
| 5,600,064 A | 2/1997 | Ward | |
| 5,635,638 A | 6/1997 | Geen | |
| 5,869,760 A | 2/1999 | Geen | |
| 5,948,981 A | 9/1999 | Woodruff | |
| 6,230,563 B1 | 5/2001 | Clark et al. | |

(Continued)

FOREIGN PATENT DOCUMENTS

| CN | 104272062 A | 1/2015 |
|---|---|---|
| CN | 102597699 B | 7/2015 |

(Continued)

OTHER PUBLICATIONS

International Search Report and Written Opinion for International Application No. PCT/US2021/036190, dated Sep. 10, 2021.

(Continued)

*Primary Examiner* — David J Bolduc
(74) *Attorney, Agent, or Firm* — Wolf, Greenfield & Sacks, P.C.

(57) ABSTRACT

A MEMS device is provided comprising a mass configured to move along a first axis and a second axis substantially perpendicular to the first axis; a drive structure coupled to the mass and configured to cause the mass to move along the first axis; a sense structure coupled to the mass and configured to detect motion of the mass along the second axis; a stress relief structure coupled to one of the drive structure or the sense structure; and at least one anchor coupled to an underlying substrate of the MEMS device, wherein the stress relief structure is coupled to the at least one anchor and the at least one anchor is disposed outside of the stress relief structure.

20 Claims, 19 Drawing Sheets

(56) References Cited

U.S. PATENT DOCUMENTS

| | | |
|---|---|---|
| 6,257,059 B1 | 7/2001 | Weinberg et al. |
| 6,296,779 B1 | 10/2001 | Clark et al. |
| 6,370,937 B2 | 4/2002 | Hsu |
| 6,481,285 B1 | 11/2002 | Shkel et al. |
| 6,505,511 B1 | 1/2003 | Geen et al. |
| 6,513,380 B2 | 2/2003 | Reeds, III et al. |
| 6,571,630 B1 | 6/2003 | Weinberg et al. |
| 6,634,231 B2 | 10/2003 | Malametz |
| 6,705,164 B2 | 3/2004 | Willig et al. |
| 6,752,017 B2 | 6/2004 | Willig et al. |
| 6,843,126 B2 | 1/2005 | Hulsing, II |
| 6,843,127 B1 | 1/2005 | Chiou |
| 6,845,668 B2 | 1/2005 | Kim et al. |
| 6,860,151 B2 | 3/2005 | Platt et al. |
| 6,877,374 B2 | 4/2005 | Geen |
| 6,883,361 B2 | 4/2005 | Wyse |
| 7,032,451 B2 | 4/2006 | Geen |
| 7,036,373 B2 | 5/2006 | Johnson et al. |
| 7,204,144 B2 | 4/2007 | Geen |
| 7,222,533 B2 | 5/2007 | Mao et al. |
| 7,227,432 B2 | 6/2007 | Lutz et al. |
| 7,258,011 B2 | 8/2007 | Nasiri et al. |
| 7,268,463 B2 | 9/2007 | Li et al. |
| 7,284,429 B2 | 10/2007 | Chaumet et al. |
| 7,287,428 B2 | 10/2007 | Green |
| 7,313,958 B2 | 1/2008 | Willig et al. |
| 7,347,094 B2 | 3/2008 | Geen et al. |
| 7,421,897 B2 | 9/2008 | Geen et al. |
| 7,675,217 B2 | 3/2010 | Delevoye et al. |
| 8,011,245 B2 | 9/2011 | Yatzenko et al. |
| 8,061,201 B2 | 11/2011 | Ayazi et al. |
| 8,096,181 B2 | 1/2012 | Fukumoto |
| 8,205,498 B2 | 6/2012 | Hsu et al. |
| 8,222,974 B2 | 7/2012 | Lutz et al. |
| 8,266,961 B2 | 9/2012 | Kuang et al. |
| 8,322,213 B2 | 12/2012 | Trusov et al. |
| 8,342,023 B2 | 1/2013 | Geiger |
| 8,354,900 B2 | 1/2013 | Cazzaniga et al. |
| 8,443,667 B2 | 5/2013 | Trusov et al. |
| 8,453,504 B1 | 6/2013 | Mao |
| 8,490,483 B2 | 7/2013 | Wrede et al. |
| 8,497,619 B2 | 7/2013 | Medhat et al. |
| 8,516,886 B2 | 8/2013 | Acar et al. |
| 8,516,889 B2 | 8/2013 | Simoni et al. |
| 8,539,832 B2 | 9/2013 | Potasek et al. |
| 8,549,919 B2 | 10/2013 | Günthner et al. |
| 8,656,776 B2 | 2/2014 | Trusov et al. |
| 8,783,105 B2 | 7/2014 | Kuhlmann et al. |
| 8,794,067 B2 | 8/2014 | Schmid et al. |
| 8,844,357 B2 | 9/2014 | Scheben et al. |
| 8,991,247 B2 | 3/2015 | Trusov et al. |
| 9,021,880 B2 | 5/2015 | Stephanou et al. |
| 9,170,107 B2 | 10/2015 | Anae et al. |
| 9,207,081 B2 | 12/2015 | Geen |
| 9,207,254 B2 | 12/2015 | Simoni et al. |
| 9,212,908 B2 | 12/2015 | Geen et al. |
| 9,217,756 B2 | 12/2015 | Simon et al. |
| 9,246,017 B2 | 1/2016 | van der Heide et al. |
| 9,360,319 B2 | 6/2016 | Jia |
| 9,493,340 B2 | 11/2016 | Mahameed et al. |
| 9,599,471 B2 | 3/2017 | Vohra et al. |
| 9,709,595 B2 | 7/2017 | Vohra et al. |
| 9,878,901 B2 | 1/2018 | Geen et al. |
| 10,167,189 B2 | 1/2019 | Zhang et al. |
| 10,168,194 B2 | 1/2019 | Vohra et al. |
| 10,203,352 B2* | 2/2019 | Zhang ................ G01P 15/18 |
| 10,209,070 B2 | 2/2019 | Geisberger |
| 10,239,746 B2 | 3/2019 | Kuang et al. |
| 10,247,554 B2 | 4/2019 | Senkal et al. |
| 10,317,210 B2 | 6/2019 | Kub et al. |
| 10,330,471 B2 | 6/2019 | Zhang |
| 10,415,968 B2 | 9/2019 | Prikhodko et al. |
| 10,451,454 B2 | 10/2019 | Vohra et al. |
| 10,514,259 B2 | 12/2019 | Jia et al. |
| 10,585,111 B2 | 3/2020 | Zhang et al. |
| 10,611,628 B2 | 4/2020 | Lee et al. |
| 10,627,235 B2 | 4/2020 | Prikhodko et al. |
| 10,655,963 B2 | 5/2020 | Ruohio et al. |
| 10,697,774 B2 | 6/2020 | Prikhodko et al. |
| 10,704,908 B1 | 7/2020 | Coronato et al. |
| 10,732,198 B2 | 8/2020 | Zhang |
| 10,746,548 B2 | 8/2020 | Gregory et al. |
| 10,759,659 B2 | 9/2020 | Zhang et al. |
| 10,816,569 B2 | 10/2020 | Zhang et al. |
| 10,882,735 B2 | 1/2021 | Kuang et al. |
| 11,460,301 B2 | 10/2022 | Geisberger |
| 2001/0042405 A1* | 11/2001 | Hulsing, II ............ G01C 19/56 73/514.01 |
| 2002/0022291 A1* | 2/2002 | Ferrari ................ G01C 19/574 257/E21.573 |
| 2002/0170355 A1 | 11/2002 | Malametz |
| 2003/0131664 A1 | 7/2003 | Mochida et al. |
| 2005/0024527 A1* | 2/2005 | Chiou ................ G01C 19/5719 396/14 |
| 2005/0092085 A1 | 5/2005 | Chen et al. |
| 2005/0139005 A1 | 6/2005 | Geen |
| 2005/0284223 A1 | 12/2005 | Karaki et al. |
| 2006/0213265 A1 | 9/2006 | Weber et al. |
| 2007/0062282 A1 | 3/2007 | Akashi et al. |
| 2007/0245826 A1* | 10/2007 | Cardarelli .......... G01C 19/5719 73/504.12 |
| 2008/0238537 A1 | 10/2008 | Belt et al. |
| 2008/0271532 A1 | 11/2008 | Platt et al. |
| 2008/0282833 A1 | 11/2008 | Chaumet |
| 2009/0223277 A1 | 9/2009 | Rudolf et al. |
| 2009/0260436 A1 | 10/2009 | Tochi et al. |
| 2010/0116050 A1 | 5/2010 | Wolfram |
| 2010/0132461 A1 | 6/2010 | Hauer et al. |
| 2010/0236327 A1 | 9/2010 | Mao |
| 2010/0300201 A1 | 12/2010 | Ge et al. |
| 2010/0313657 A1 | 12/2010 | Trusov et al. |
| 2012/0060604 A1 | 3/2012 | Neul et al. |
| 2012/0125099 A1 | 5/2012 | Scheben et al. |
| 2012/0198934 A1* | 8/2012 | Cardarelli ............... G01P 21/00 73/504.02 |
| 2012/0210788 A1 | 8/2012 | Günther et al. |
| 2012/0222483 A1 | 9/2012 | Blomqvist et al. |
| 2012/0310067 A1 | 12/2012 | Najafi et al. |
| 2013/0192363 A1 | 8/2013 | Loreck |
| 2013/0269413 A1 | 10/2013 | Tao et al. |
| 2014/0190258 A1 | 7/2014 | Donadel et al. |
| 2014/0192061 A1 | 7/2014 | Payne et al. |
| 2014/0260608 A1 | 9/2014 | Lin et al. |
| 2014/0260610 A1 | 9/2014 | McNeil et al. |
| 2015/0128701 A1 | 5/2015 | Vohra et al. |
| 2015/0226558 A1* | 8/2015 | Seeger ................ G01C 19/574 73/504.12 |
| 2015/0285633 A1 | 10/2015 | Kamal Said Abdel Aziz et al. |
| 2015/0316378 A1 | 11/2015 | Kergueris et al. |
| 2015/0330783 A1 | 11/2015 | Rocchi et al. |
| 2015/0336790 A1 | 11/2015 | Geen et al. |
| 2016/0025493 A1 | 1/2016 | Stewart |
| 2016/0033274 A1* | 2/2016 | Reinmuth .......... G01C 19/5769 73/504.12 |
| 2016/0264404 A1 | 9/2016 | Acar |
| 2016/0265916 A1 | 9/2016 | Kergueris et al. |
| 2016/0316146 A1 | 10/2016 | Kajimura |
| 2016/0349056 A1 | 12/2016 | Thompson et al. |
| 2018/0038887 A1* | 2/2018 | Zhang ................ G01P 15/125 |
| 2018/0058853 A1* | 3/2018 | Jia ...................... G01C 19/5712 |
| 2018/0172445 A1 | 6/2018 | Prikhodko et al. |
| 2018/0172446 A1 | 6/2018 | Prikhodko et al. |
| 2018/0172447 A1 | 6/2018 | Prikhodko et al. |
| 2018/0216935 A1 | 8/2018 | Senkal et al. |
| 2018/0299269 A1 | 10/2018 | Anac et al. |
| 2018/0340775 A1* | 11/2018 | Kuisma .............. G01C 19/5642 |
| 2019/0033075 A1 | 1/2019 | Wu et al. |
| 2019/0187169 A1 | 6/2019 | Tang et al. |
| 2019/0310087 A1 | 10/2019 | Gregory et al. |
| 2019/0383612 A1 | 12/2019 | Geisberger |
| 2020/0025790 A1 | 1/2020 | Reinke |
| 2020/0081029 A1 | 3/2020 | Zhang et al. |
| 2020/0132716 A1 | 4/2020 | Zhang |
| 2020/0249020 A1 | 8/2020 | Prikhodko et al. |

(56) References Cited

U.S. PATENT DOCUMENTS

| | | | |
|---|---|---|---|
| 2020/0263987 A1* | 8/2020 | Blomqvist | G01C 19/5712 |
| 2020/0408801 A1 | 12/2020 | Vohra et al. | |
| 2021/0278847 A1 | 9/2021 | Prikhodko et al. | |
| 2021/0381832 A1* | 12/2021 | Prikhodko | G01C 19/5712 |
| 2022/0057208 A1 | 2/2022 | Prikhodko et al. | |

FOREIGN PATENT DOCUMENTS

| | | |
|---|---|---|
| CN | 105366627 B | 3/2017 |
| CN | 206321662 U | 7/2017 |
| CN | 107782299 A | 3/2018 |
| CN | 108204806 A | 6/2018 |
| CN | 106932609 B | 5/2019 |
| CN | 209024198 U | 6/2019 |
| CN | 209841242 U | 12/2019 |
| CN | 110902640 A | 3/2020 |
| CN | 111148000 A | 5/2020 |
| JP | 2011145129 A | 7/2011 |
| JP | 5143267 B2 | 2/2013 |
| JP | 2014-510271 | 4/2014 |
| KR | 20110018926 A | 2/2011 |
| KR | 101776583 B1 | 9/2017 |
| WO | WO 2009/145967 A1 | 12/2009 |
| WO | WO 2012/120190 A2 | 9/2012 |

OTHER PUBLICATIONS

International Search Report and Written Opinion for International Application No. PCT/US2021/036259, dated Sep. 15, 2021.

International Search Report and Written Opinion for International Application No. PCT/US2021/47387, dated Nov. 23, 2021.

Miao et al., A novel method of quadrature compensation in the butterfly resonator based on modal stiffness analysis. AIP Advances. Oct. 22, 2018;8(10):105025. 14 pages.

Kranz et al., Micromechanical vibratory rate gyroscopes fabricated in conventional CMOS. Proc. Symposium Gyro Technology. Deutsche Gesellschaft Fuer Ortung Und Navigation, 1997. Stuttgart,Germany. Sep. 16-17; pp. 3.0-3.8.

Kranz, Design, Simulation and Implementation of Two Novel Micromechanical Vibratory-Rate Gyroscopes. Department of Electrical and Computer Engineering. Carnegie Mellon University. May 1988. 41 pages.

Kumar et al., Amplitude modulated Lorentz force MEMS magnetometer with picotesla sensitivity. Journal of Micro mechanics and Microengineering. Sep. 20, 2016; 26(10): http://iopscience.iop.org/article/10.1088/0960-1317/26/10/105021/meta#fnref-jmmaa3949bib003.

Li et al., Design and Mechanical Sensitivity Analysis of a MEMS Tuning Fork Gyroscope with an Anchored Leverage Mechanism. Sensors. Aug. 7, 2019; 19:3455.

Li et al., Three-Axis Lorentz-Force Magnetic Sensor for Electronic Compass Applications. Journal of Microelectromechanical Systems. Aug. 2012;21(4):1002 http://ieeexplore.ieee.org/stamp/stamp.jsp?arnumber=6198750.

Liu, Flexure Design for Eight-Bar Rectilinear Motion Mechanism. Thesis submitted in partial satisfaction of the requirements for the degree of Master of Science in Mechanical and Aerospace Engineering. UC Irvine Electronic Theses and Dissertations. 2015; 70 pages.

Park et al., Dynamics and control of a MEMS angle measuring gyroscope. Sensors and Actuators A: Physical 144.1 (2008): 56-63.

Prikhodko et al., Foucault Pendulum on a Chip: Angle Measuring Silicon Mems Gyroscope. 2011 IEEE 24th International Conference on Micro Electro Mechanical Systems (MEMS 2011), Cancun, Mexico. Jan. 23-27, 2011;161-4.

Trusov et al., Flat is Not Dead: Current and Future Performance of Si-MEMS Quad Mass Gyro (QMG) System. 2014 IEEE/ION Position, Location and Navigation Symposium. (PLANS 2014). May 5-8, 2014. 7 pages.

Trusov et al., Force Rebalance, Whole Angle, and Self-Calibration Mechanization of Silicon MEMS Quad Mass Gyro. IEEE 2014 International Symposium on Inertial Sensors and Systems (ISISS). Feb. 25-26, 2014;149-50.

Zaman et al., A mode-matched silicon-yaw tuning-fork gyroscope with subdegree-per-hour Allan deviation bias instability. Journal of Microelectromechanical Systems 17.6 (2008): 1526-36.

U.S. Appl. No. 17/410,924, filed Aug. 23, 2021, Prikhodko et al.

PCT/US2021/036259, Sep. 15, 2021, International Search Report and Written Opinion.

PCT/US2021/036190, Sep. 10, 2021, International Search Report and Written Opinion.

PCT/US2021/47387, Nov. 23, 2021, International Search Report and Written Opinion.

International Preliminary Report on Patentability dated Dec. 22, 2022 in connection with International Application No. PCT/US2021/036259.

International Preliminary Report on Patentability dated Dec. 22, 2022 in connection with International Application No. PCT/US2021/036190.

PCT/US2021/036259, Dec. 22, 2022, International Preliminary Report on Patentability.

PCT/US2021/036190, Dec. 22, 2022, International Preliminary Report on Patentability.

* cited by examiner

DRIVE AND SENSE STRESS RELIEF APPARATUS

CROSS-REFERENCE TO RELATED APPLICATIONS

This application claims the benefit under 35 U.S.C. § 119(e) of U.S. Provisional Patent Application Ser. No. 63/036,273, filed Jun. 8, 2020, and entitled "DRIVE AND SENSE STRESS RELIEF APPARATUS," which is hereby incorporated herein by reference in its entirety.

FIELD

The present application relates to stress relief structures for microelectromechanical systems (MEMS) inertial sensors.

BACKGROUND

MEMS devices may comprise multiple moving masses coupled together by one or more couplers. For example, gyroscopes (sometimes referred to simply as "gyros") are devices which are sensitive to rotation, and therefore which can be used to detect rotation. MEMS gyroscopes typically include a movable body, sometimes referred to as a "proof mass," to which an electrical signal is applied to produce motion predominantly along a particular axis. This is referred to as driving the proof mass, and the axis along which the proof mass is driven is sometimes referred to as the drive axis. When the gyroscope experiences rotation, the proof mass additionally moves along an axis different than the drive axis, sometimes referred to as the sense axis. The motion of the proof mass along the sense axis is detected, providing an indication of the rotation experienced by the gyroscope. For some MEMS gyroscopes, driving the proof mass may comprise causing motion of the proof mass in-plane. For some MEMS gyroscopes, rotation may be detected by sensing out-of-plane motion of the proof mass.

BRIEF SUMMARY

Some aspects are directed to a MEMS device comprising: a mass configured to move along a first axis and a second axis substantially perpendicular to the first axis; a drive structure coupled to the mass and configured to cause the mass to move along the first axis; a sense structure coupled to the mass and configured to detect motion of the mass along the second axis; and a stress relief structure comprising a frame coupled to one of the drive structure or the sense structure, wherein the frame comprises: a plurality of L-shaped beams including a first L-shaped beam coupled to the one of the drive structure or the sense structure at at least one first point and a second L-shaped beam coupled to the one of the drive structure or the sense structure at at least one second point; and a plurality of U-shaped beams including a first U-shaped beam coupled to a vertex of the first L-shaped beam and a second U-shaped beam coupled to a vertex of the second L-shaped beam.

Some aspects are directed to a MEMS device comprising: a mass configured to along a first axis and a second axis substantially perpendicular to the first axis; a drive structure coupled to the mass and configured to cause the mass to move along the first axis; a sense structure coupled to the mass and configured to detect motion of the mass along the second axis; a stress relief structure coupled to one of the drive structure or the sense structure; and at least one anchor coupled to an underlying substrate of the MEMS device, wherein the stress relief structure is coupled to the at least one anchor and the at least one anchor is disposed outside of the stress relief structure.

Some aspects are directed to a stress relief structure for coupling to one of a drive structure or a sense structure of a MEMS device, the stress relief structure comprising: a frame comprising: a plurality of L-shaped beams including a first L-shaped beam and a second L-shaped beam; and a plurality of U-shaped beams including a first U-shaped beam coupled to a vertex of the first L-shaped beam and a second U-shaped beam coupled to a vertex of the second L-shaped beam, wherein the frame exhibits rotational symmetry within an x-y plane.

BRIEF DESCRIPTION OF DRAWINGS

Various aspects and embodiments of the application will be described with reference to the following figures. It should be appreciated that the figures are not necessarily drawn to scale. Items appearing in multiple figures are indicated by the same reference number in all the figures in which they appear. For purposes of clarity, not every component may be labeled in every drawing.

DETAILED DESCRIPTION

Figure 1A:
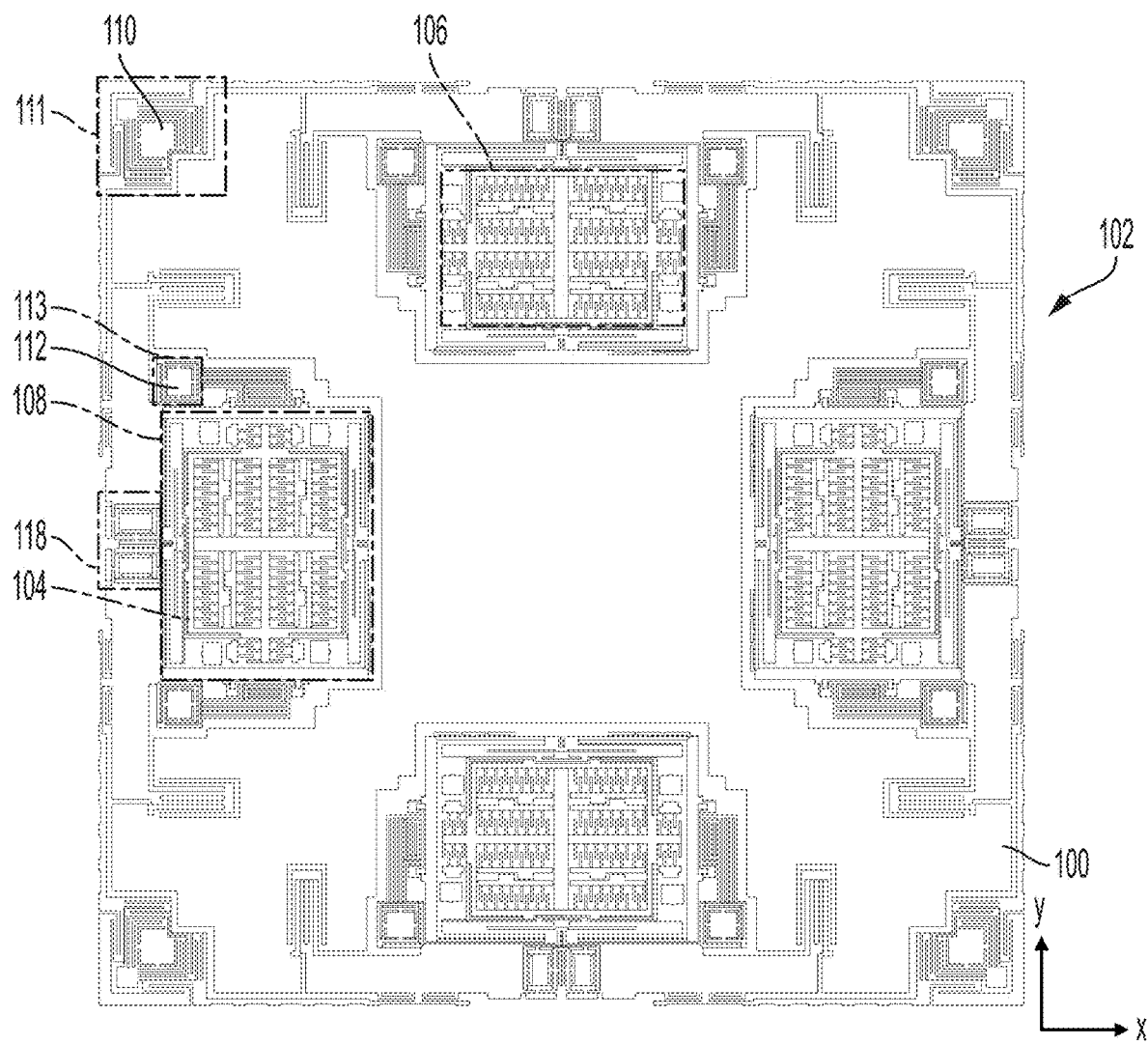
FIG. 1A illustrates a portion of an example MEMS device having a stress relief structure, according to some non-limiting embodiments.

MEMS devices, such as MEMS gyroscopes, are subject to stress which may lead to non-linearity and quadrature. Quadrature is motion of the proof mass in the direction orthogonal to the drive motion, which is ideally 90° out of phase with the Coriolis response. Typically, quadrature is undesirable, as the gyroscope may be unable to distinguish between electrical signals resulting from quadrature as opposed to those resulting from rotation, and thus the accuracy of the gyroscope at detecting rotation may be negatively impacted by the occurrence of quadrature.

Aspects of the present application relate to stress relief structures and related aspects which function to improve stress relief of a MEMS device, thereby improving the linearity of the MEMS device and reducing quadrature. According to some aspects, the stress relief structures described herein reduce shear, normal, and/or dynamic resonator stresses in a MEMS device. According to some aspects, the improved stress relief structures improve the overall symmetry of the MEMS device.

In some embodiments, a MEMS device is provided having anchors which improve stress relief of the MEMS device. For example, the MEMS device may be configured such that anchors are connected to other components of the MEMS device by multiple connections (e.g., two connections, four connections) disposed symmetrically about the anchor. In some embodiments, the MEMS device is configured having multiple pivot points (e.g., at least two pivot points, at least three pivot points) about an anchor.

Thus, according to an aspect of the present application, there is provided a MEMS device comprising a mass configured to move along a first axis and a second axis substantially perpendicular to the first axis, a drive structure coupled to the mass and configured to cause the mass to move along the first axis, a sense structure coupled to the mass and configured to detect motion of the mass along the second axis, and a stress relief structure comprising a frame coupled to one of the drive structure or the sense structure, wherein the frame comprises: a plurality of L-shaped beams including a first L-shaped beam coupled to the one of the drive structure or the sense structure at at least one first point and a second L-shaped beam coupled to the one of the drive structure or the sense structure at at least one second point, and a plurality of U-shaped beams including a first U-shaped beam coupled to a vertex of the first L-shaped beam and a second U-shaped beam coupled to a vertex of the second L-shaped beam.

Some embodiments provide for a MEMS device comprising a mass configured to move along a first axis and a second axis substantially perpendicular to the first axis, a drive structure coupled to the mass and configured to cause the mass to move along the first axis, a sense structure coupled to the mass and configured to detect motion of the mass along the second axis, a stress relief structure coupled to one of the drive structure or the sense structure, and at least one anchor coupled to an underlying substrate of the MEMS device, wherein the stress relief structure is coupled to the at least one anchor and the at least one anchor is disposed outside of the stress relief structure.

In some embodiments, there is provided a stress relief structure for coupling to one of a drive structure or a sense structure of a MEMS device, the stress relief structure comprising a frame comprising a plurality of L-shaped beams including a first L-shaped beam and a second L-shaped beam, and a plurality of U-shaped beams including a first U-shaped beam coupled to a vertex of the first L-shaped beam and a second U-shaped beam coupled to a vertex of the second L-shaped beam, wherein the frame exhibits rotational symmetry within an x-y plane.

In some embodiments, aspects of the present disclosure may be implemented in a MEMS inertial sensor, such as a MEMS gyroscope. Example MEMS gyroscopes in which aspects of the present disclosure may be implemented in are provided and further described herein, for example, in FIGS. 11A-11B.

The aspects and embodiments described above, as well as additional aspects and embodiments, are described further below. These aspects and/or embodiments may be used individually, all together, or in any combination, as the technology is not limited in this respect.

Figure 11A:
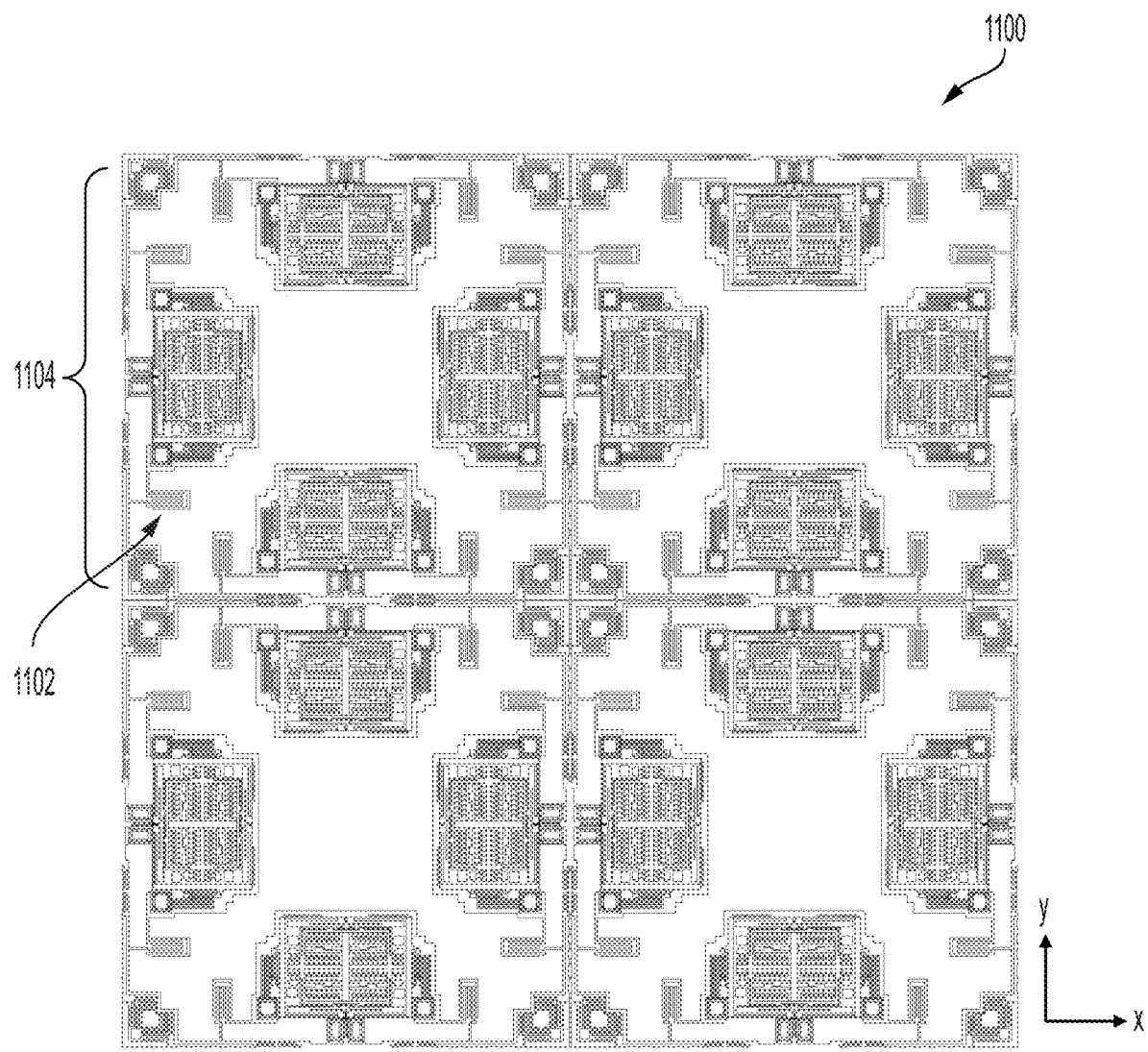
FIG. 11A illustrates an example MEMS gyroscope having four proof masses, according to some non-limiting embodiments.
Figure 11B:
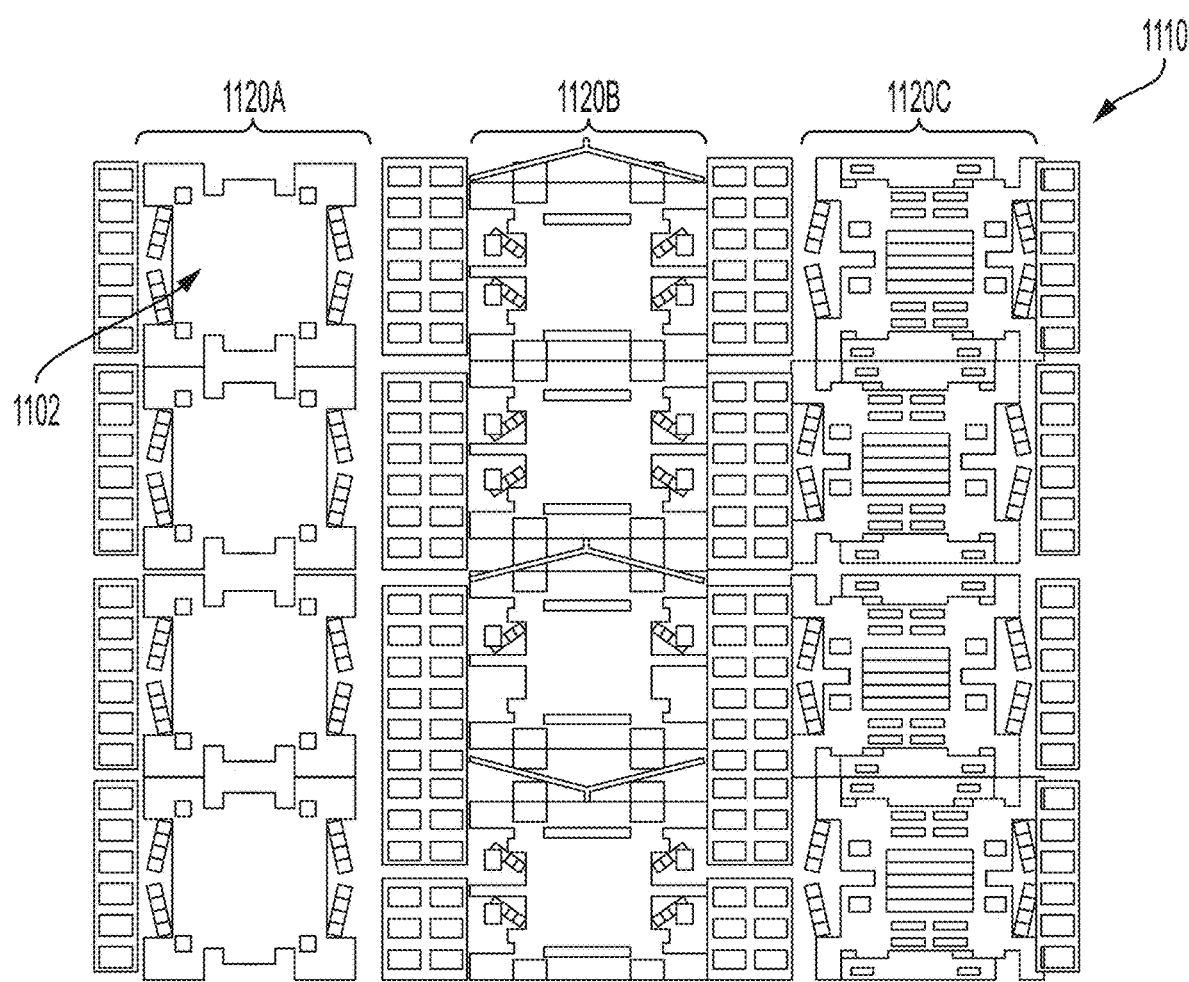
FIG. 11B illustrates an example MEMS gyroscope having twelve proof masses, according to some non-limiting embodiments.

FIG. 1A illustrates an example MEMS device 100 having stress relief structures which reduce one or more types of stress (e.g., normal, shear, dynamic) experienced by the MEMS device thereby reducing non-linearity and quadrature of the MEMS device, according to some non-limiting embodiments. FIG. 1A illustrates aspects of the present disclosure which may facilitate improved stress relief for the MEMS device 100. It should be appreciated that aspects of FIG. 1A and some subsequent figures shown herein have been simplified for the purposes of illustration. Additional details of components of the MEMS device 100 are shown in subsequent figures. Further, the MEMS devices described herein may have one or more additional features not shown in the illustrated embodiments. The example MEMS device 100 may comprise a portion of a larger MEMS device, for example, as shown in FIGS. 11A-11B.

The MEMS device 100 comprises a proof mass 102. The proof mass 102 may be suspended above and coupled to an underlying substrate (not shown). The MEMS device 100 may be configured to detect angular rates through detection of Coriolis forces. For example, the proof mass 102 may be configured to move along a first axis (e.g., the x-axis) and a second axis substantially perpendicular to the first axis (e.g., the y-axis). In some embodiments, the proof mass 102 may be configured to move in-plane and/or out-of-plane.

The Coriolis effect, and hence a Coriolis force, arises when 1) a proof mass oscillates; and 2) the MEMS device (e.g., MEMS gyroscope) is subjected to angular motion. In the example shown in FIGS. 1A-1C, the proof mass 102 may be driven to oscillate along the x-axis, and a Coriolis force arises when the proof mass 102 undergoes angular motion in the plane of the page (e.g., the x-y plane, about an axis through the page). The Coriolis force may cause the proof mass 102 to be displaced along the y-axis. The MEMS device 100 may be configured to sense the displacement of the proof mass 102 to measure rotation. In some embodiments, for example as shown in FIGS. 11A-11B, one or more additional proof masses may be provided to sense rotation about a same or different axis as proof mass 102.

MEMS device 100 further comprises drive structures 104 and sense structures 106. A drive structure is a structure configured to cause motion of a proof mass of the MEMS device 100. Drive structures 104 may include drive capacitors, in which electrostatic forces are used to cause motion of the proof mass 102. For example, a drive structure 104 may comprise a first plurality of electrodes being spaced a distance from a second plurality of electrodes which are coupled to the underlying substrate. A voltage may be applied to the second plurality of electrodes causing the distance between the first and second plurality of electrodes to change. The drive structures may therefore oscillate in response to the voltage applied to the second plurality of electrodes by virtue of the change in distance between the first and second plurality of electrodes. Motion of the drive structures 104 may be transferred to the proof mass 102 as further described herein.

A sense structure is a structure configured to detect motion of a proof mass of the MEMS device 100. For example, sense structures 106 may sense motion of the proof mass 102 caused by Coriolis forces arising when the proof mass 102 undergoes angular motion. Motion of the proof mass 102 caused by Coriolis forces may be transferred to the sense structures 106 causing the sense structures to oscillate as further described herein. Sense structures 106 may include sense capacitors, in which electrostatic forces are generated when a distance between electrodes coupled to a sense structure and electrodes coupled to the underlying substrate is changed. The Coriolis translational motion of the proof mass may be determined based on the generated electrostatic Coriolis force due to angular rotation.

In the illustrated embodiments, the proof mass 102 comprises two drive structures (first and second drive structures 104A, 104B) and two sense structures (first and second sense structures 106A, 106B). However, any suitable number of drive structures and sense structures may be implemented and coupled to the proof mass 102.

According to some embodiments, the MEMS device 100 further comprises an improved stress relief structure 108 shown in FIG. 1A, which couples a frame of a drive and/or sense structure to one or more respective anchors. In the illustrated embodiment, there is provided a stress relief structure 108 coupled to each of the drive structures 104 and sense structures 106. The stress relief structure 108 may comprise a means for relieving stress between the drive or sense structure to which the stress relief structure is coupled to and an anchor coupled to the underlying substrate. For example, the stress relief structure 108 may decrease shear, normal, and/or dynamic resonator stresses affecting the drive or sense structure to which the stress relief structure is coupled. The stress relief structure 108 may decrease quadrature, in some embodiments.

The stress relief structure 108 may comprise at least one U-shaped beam and at least one L-shaped beam, as is further described herein. In some embodiments, the stress relief structures may be coupled to respective frames of one or more drive structures and one or more sense structures of the MEMS gyroscope. In particular, for a MEMS gyroscope having decoupled drive and sense structures, both the drive and sense structures may have stress relief structures of the type described herein. Further aspects of the stress relief structure 108 are described herein.

The one or more respective anchors to which a stress relief structure 108 is coupled may be disposed substantially outside of the frame of the drive or sense structure to which the stress relief structure is coupled. For example, as shown in FIG. 1A, the stress relief structure 108 coupled to drive structure 104 is coupled to anchor 112 which is disposed substantially outside of a frame of drive structure 104 as well as substantially outside stress relief structure 108. Anchors of the MEMS device 100, such as anchor 112, may be coupled to an underlying substrate. The stress relief structure 108 may be coupled directly to the respective anchors.

According to some embodiments, the MEMS device 100 comprises multiple anchor connections 111, 113 for coupling the MEMS device 100 to a respective anchor. The anchor connections 111, 113 may be substantially symmetric to each other, as shown in FIG. 1A (e.g., at anchor 112, anchor 110). For example, in some embodiments, the MEMS device comprises at least two anchor connections for coupling components of the MEMS device to a respective anchor, the at least two anchor connections being disposed substantially opposite each other (e.g., at diagonals of the anchor). In some embodiments, the MEMS device comprises four anchor connections for coupling components of the MEMS device to a respective anchor, each of the four anchors being disposed substantially opposite each other (e.g., at sides of the anchor).

According to some embodiments, respective anchors of the MEMS device 100 (e.g., anchor 110, anchor 112) may be configured having at least two pivot points, as shown in FIG. 1A. Further aspects of anchor pivots are described herein, for example, with respect to FIGS. 9A-10B.

As described herein, motion may be transferred between a respective drive structure 104 or sense structure 106 and the proof mass 102. For example, in a drive mode of operation described further herein, motion of a drive structure 104 may be transferred to the proof mass 102 causing proof mass 102 to oscillate. In a sense mode of operation, motion of the proof mass 102 arising from Coriolis forces may be transferred to the sense structure 106. Such transfer of motion may be facilitated by a coupler between the proof mass 102 and respective drive or sense structures. The coupler may comprise a pair of levers 114. The levers 114 may be coupled together at point 118. According to some embodiments, respective levers of the MEMS device may be configured have at least two pivot points, as shown in FIG. 1A at point 118.

Figure 1B:
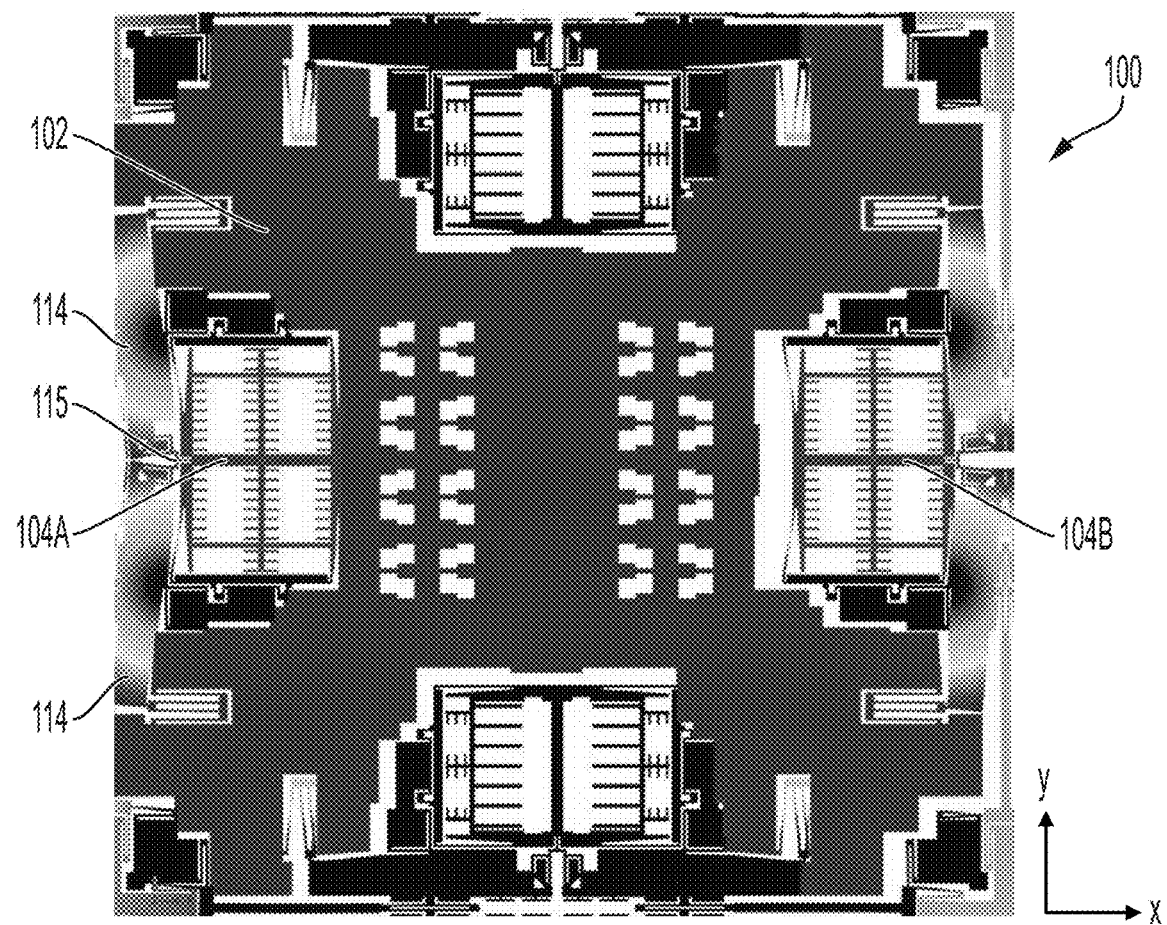
FIG. 1B illustrates motion of the example MEMS device of FIG. 1A in a drive mode, according to some non-limiting embodiments.
Figure 1C:
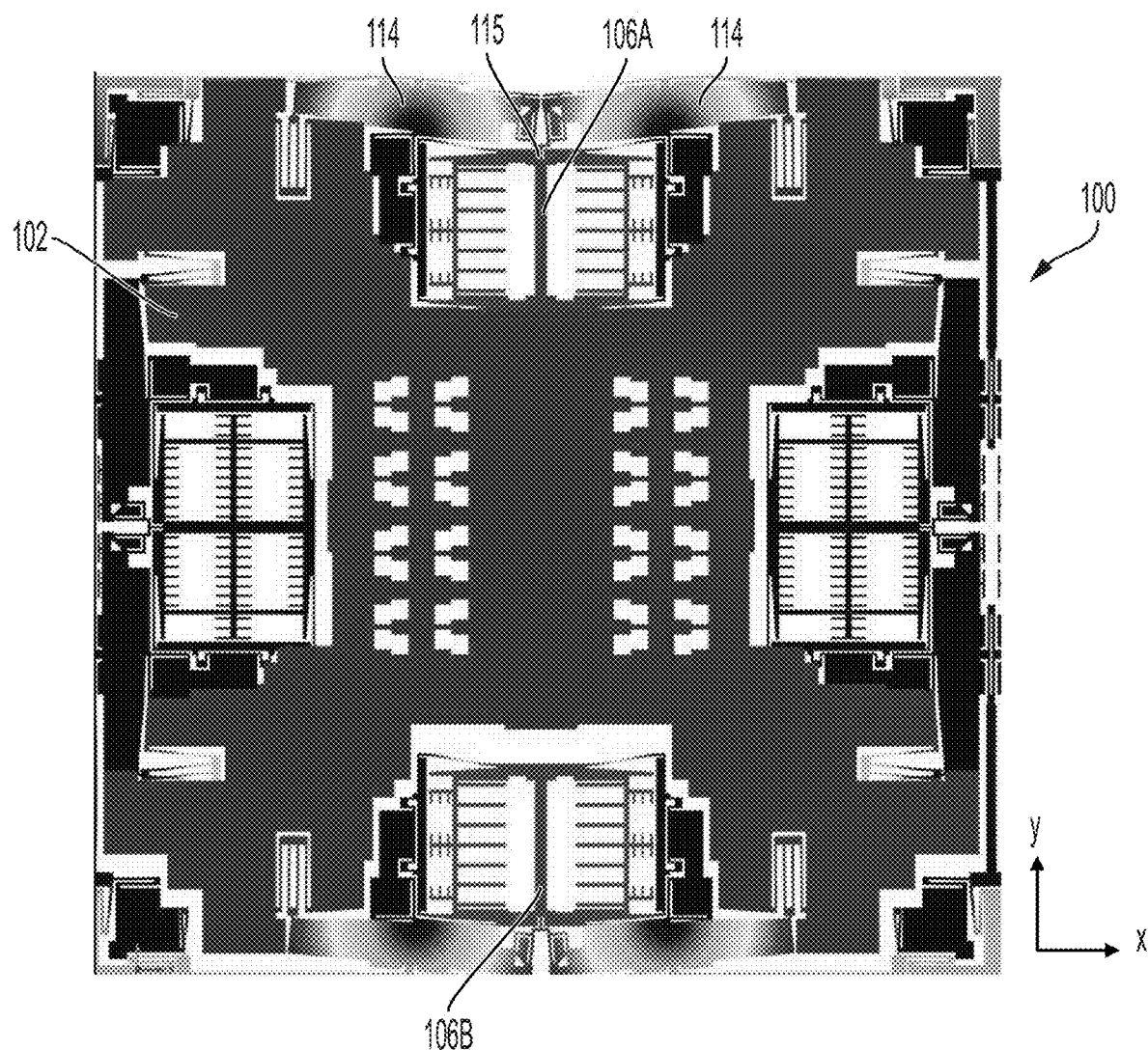
FIG. 1C illustrates motion of the example MEMS device of FIG. 1A in a sense mode, according to some non-limiting embodiments.

FIGS. 1B-1C illustrate motion of the example MEMS device 100 of FIG. 1A in a drive mode and a sense mode, respectively. For simplicity, not all aspects of the MEMS device 100 of FIG. 1A are illustrated in FIGS. 1B-1C.

FIG. 1B illustrates motion of the example MEMS device 100 of FIG. 1A in a drive mode, according to some non-limiting embodiments. As described herein, the MEMS device 100 of FIG. 1A may be a MEMS gyroscope configured to detect angular rates through detection of Coriolis forces. In this example, the proof mass 102 is driven to oscillate along the x-axis, and a Coriolis force arises when the proof mass 102 undergoes angular motion in the plane of the page, about an out-of-plane axis (e.g., the z-axis) causing the proof mass to be displaced along the y-axis. The MEMS device 100 may be configured to sense the displacement of the proof mass to measure rotation.

As described herein, the MEMS device 100 may comprise one or more drive structures 104A, 104B configured to drive the proof mass along the x-axis. In the illustrated embodiment of FIG. 1B, the MEMS device 100 comprises two drive structures 104A, 104B coupled to the proof mass 102 and disposed substantially opposite each other. Motion of the drive structures 104A, 104B may be transferred to the proof mass 102 via levers 114. A pair of levers 114 may be coupled to a respective drive structure 104. When the drive structure 104 oscillates, the pair of levers 114 may pivot, as shown in FIG. 1B, about pivot point 115. In some embodiments, each of the levers 114 have multiple pivot points, as described herein.

FIG. 1C illustrates motion of the example MEMS device 100 of FIG. 1A in a sense mode, according to some non-limiting embodiments. In the illustrated embodiment, the sense mode of the MEMS device 100 comprises motion of the proof mass 102 along the y-axis. As described herein, the MEMS device 100 may be configured to sense the rotation of the proof mass 102 about an out-of-plane axis (e.g., the z-axis) caused by Coriolis forces to detect rotation. In particular, the MEMS device may comprise one or more sense structures 106A 106B configured to sense motion of the proof mass 102 along the y-axis to measure Coriolis forces acting upon the proof mass 102. In the illustrated embodiment of FIG. 1C, the MEMS device comprises two sense structures 106A, 106B coupled to the proof mass 102 and disposed substantially opposite each other.

Motion of the sense structures 106A, 106B may be coupled to the proof mass 102 via levers 114. A pair of levers 114 may be coupled to a respective sense structure 106. When the proof mass 102 oscillates, the pair of levers 114 may pivot, as shown in FIG. 1C, about pivot point 115. In some embodiments, each of the levers 114 have multiple pivot points, as described herein.

Although in the illustrated embodiment, the drive and sense modes are along the x and y axes, respectively, in other embodiments, drive and sense motion may be along any combination of the x, y, and/or z axes.

Figure 2:
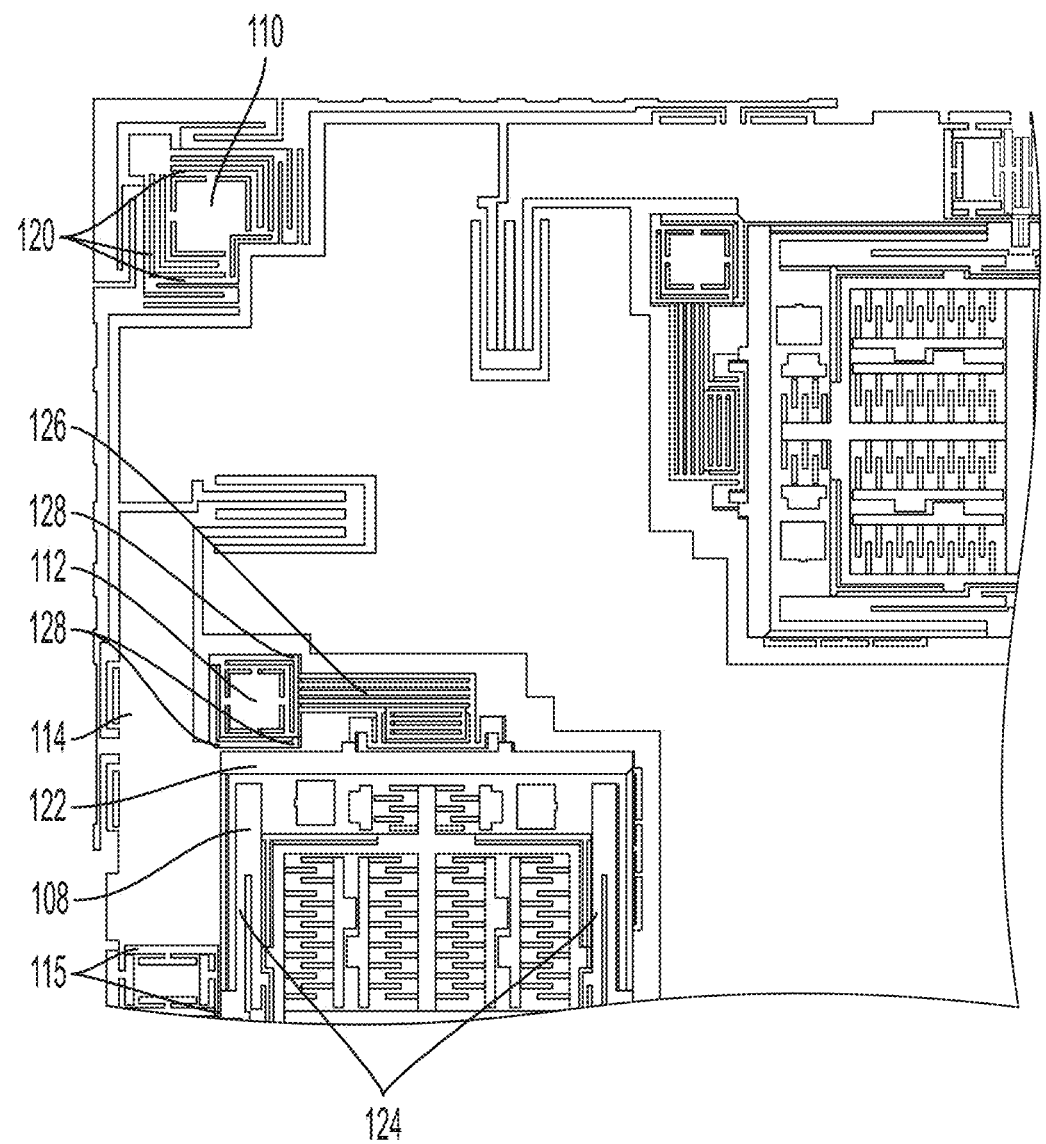
FIG. 2 is an enlarged view of a portion of the example MEMS device of FIG. 1, according to some non-limiting embodiments.

MEMS gyroscopes, as described herein are subject to high non-linearity and shear stress which can cause quadrature. The inventors have recognized that implementing the MEMS device with a stress relief structure and related aspects described herein may be advantageous to improve stress relief of the MEMS device thereby reducing non-linearity and quadrature. FIG. 2 is an enlarged view of a portion of the example MEMS device of FIG. 1, according to some non-limiting embodiments, highlighting aspects of the technology described herein which may provide for improved stress relief of the MEMS device.

For example, FIG. 2 illustrates a stress relief structure 108 which couples a frame of the drive and/or sense structure to a respective anchor, here, anchor 112. The anchor 112 is coupled to a frame 122 of the stress relief structure 108 by an arm 126. In some embodiments, the arm 126 may be rigid. In some embodiments, the arm 126 may be coupled to each of the frame 122 and the anchor 112 via one or more springs. The arm 126 may be coupled to the anchor 112 at a plurality of points. In some embodiments, connections to the anchor 112 are disposed symmetrically about the anchor 112. For example, as shown in FIG. 2, the MEMS device 100 comprises four connections to the anchor 112 disposed on respective sides of the anchor 112. Further aspects of the anchor connections are described herein.

In some embodiments, the MEMS device 100 may comprise multiple pivot points about the one or more anchors that are coupled to a drive or sense structure. For example, the MEMS device 100 comprises three pivot points 128. Further aspects of the multiple pivot points are described herein.

As shown in FIG. 2, the MEMS device 100 comprises one or more anchors coupled to an outer frame of the MEMS device. For example, anchor 110 is shown in FIG. 2. As described herein, for example, with respect to FIGS. 10A-10B, the anchor 110 may comprise multiple pivot points (e.g., at least two pivots, at least three pivots) such that the MEMS device 100 can pivot about each of the multiple pivot points of the anchor 110. In some embodiments, an outer frame of the MEMS device 100 may be coupled to the anchor 110 via one or more springs 120. Connections to the anchor 112 may be disposed symmetrically about the anchor 110. For example, as shown in FIG. 2, the MEMS device 100 comprises four connections to the anchor 110 disposed on respective sides of the anchor 110.

FIG. 2 illustrates a first lever 114 of the coupler that couples drive structure 104 to proof mass 102. As shown in FIG. 2, lever 114 comprises a box spring. The MEMS device 100 may comprise two pivot points 115 disposed on the box spring, such that the lever 114 is configured to pivot about the two pivot points 115. The pivot points 115 of lever 114 shown in FIG. 2 are disposed on opposite diagonals of the box spring.

Figure 3:
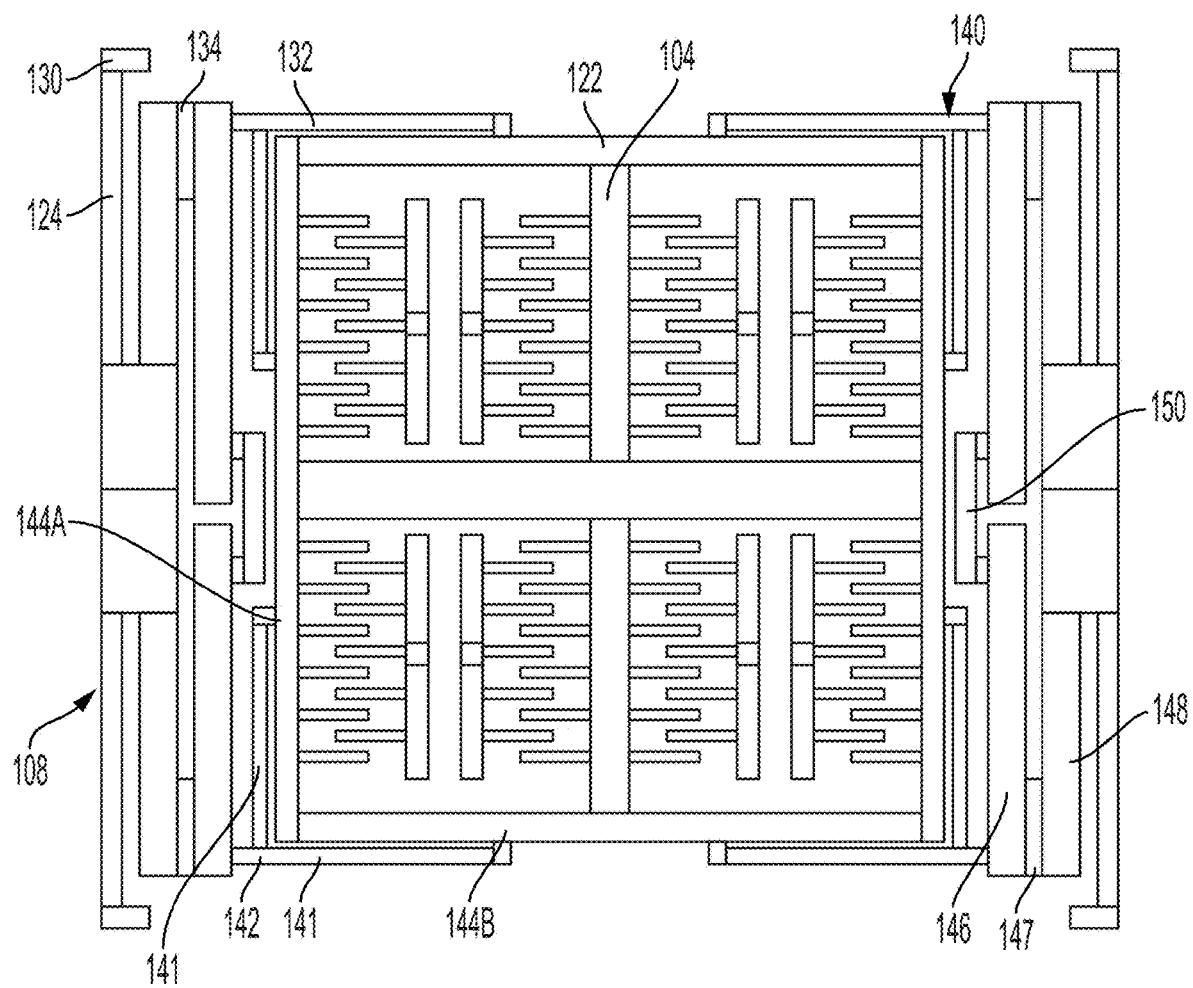
FIG. 3 is a schematic diagram of an example stress relief structure coupled to a drive structure of a MEMS inertial sensor, according to some non-limiting embodiments.
Figure 4:
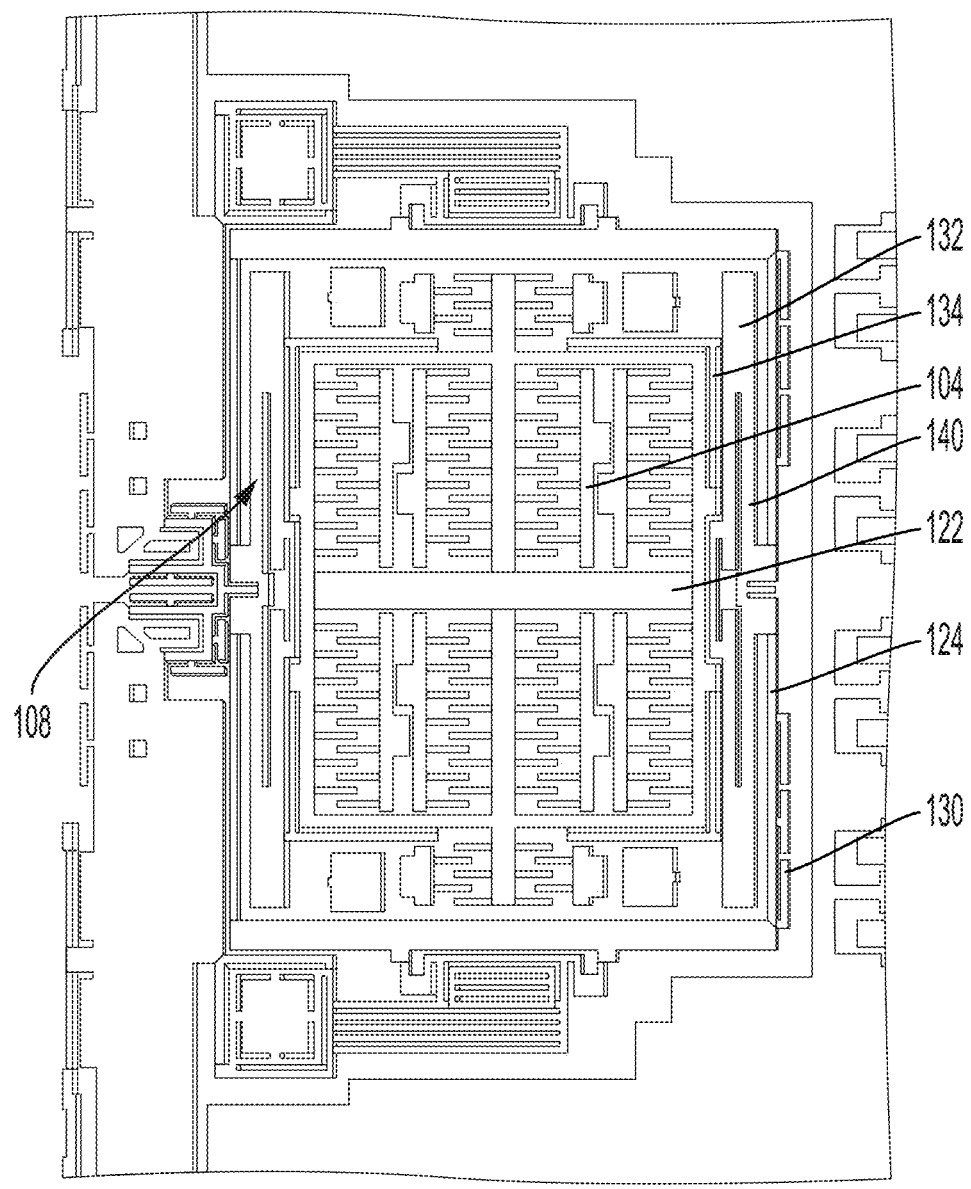
FIG. 4 illustrates a portion of the example MEMS device of FIG. 1 illustrating the example stress relief structure of FIG. 3 being coupled to a drive structure of the MEMS device, according to some non-limiting embodiments.
Figure 5:
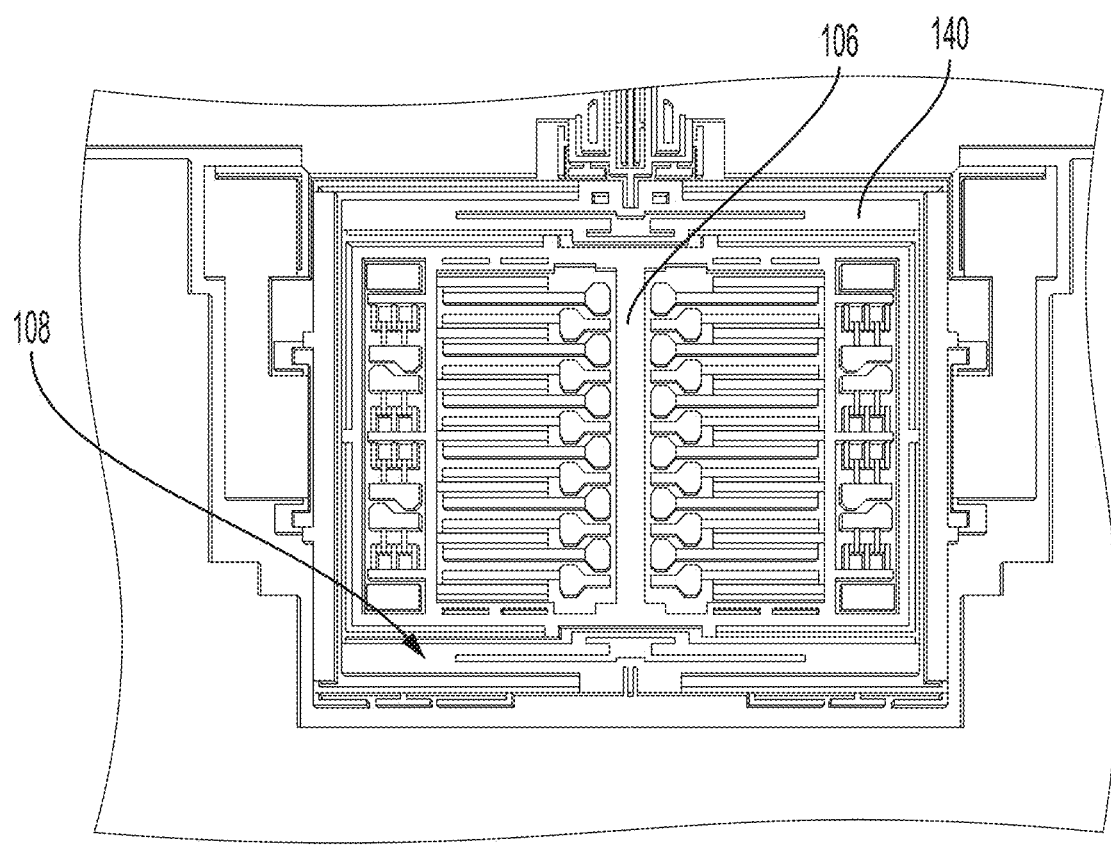
FIG. 5 illustrates an enlarged portion of the example MEMS device of FIG. 1 illustrating the example stress relief structure of FIG. 3 being coupled to a sense structure of the MEMS device, according to some non-limiting embodiments.

FIGS. 3-5 illustrate aspects of a stress relief structure coupled to a MEMS device. FIG. 3 is a schematic diagram of an example stress relief structure 108 coupled to a drive structure of a MEMS inertial sensor, according to some non-limiting embodiments.

In the illustrated embodiment of FIG. 3, the stress relief structure 104 is coupled to a frame 122 of a drive structure 104. In some embodiments, a stress relief structure may additionally or alternatively be coupled to one or more sense structures of the MEMS device. As shown in FIG. 3, the drive structure 104 may be disposed substantially inside of the stress relief structure 104.

As described herein, the stress relief structure 108 may comprise a means for relieving stress between the drive or sense structure to which the stress relief structure is coupled to and an anchor coupled to the underlying substrate. For example, the stress relief structure 108 may decrease shear, normal, and/or dynamic resonator stresses affecting the drive or sense structure to which the stress relief structure is coupled. The stress relief structure 108 may decrease quadrature, in some embodiments.

The stress relief structure 108 may comprise a frame 140 comprised of a plurality of beams. For example, as shown in the illustrated embodiment, frame 140 comprises a plurality of L-shaped beams 132 and a plurality of U-shaped beams 134.

At least one of the plurality of L-shaped beams 132 may be coupled to the drive or sense structure disposed substantially inside the frame 140 of the stress relief structure 108. In the illustrated embodiment, the frame 140 comprises four L-shaped beams. The frame 140 may comprise a respective one of the plurality of L-shaped beams 132 in each corner of the frame 140.

Each L-shaped beam may comprise two legs 141 joined together at a vertex 142. For example, a first end of a leg 141 may be coupled to the drive structure 104 and a second end of the leg 141 may be coupled to the other leg 141 of the L-shaped beam 132 at the vertex 142. Accordingly, the L-shaped beam 132 may be coupled to the drive structure 104 at two points, a first point 144A by a first leg 141 and a second point 144B by a second leg 141.

In some embodiments, the legs 141 have substantially the same length. In other embodiments, one of the legs 141 is longer than the other of the two legs 141. In some embodiments, the legs 141 are integral with each other. In other embodiments, the legs 141 are coupled together at the vertex 142 by any suitable coupling means.

U-shaped beams 134 and L-shaped beam 132 may be relatively more rigid than spring 124 coupling the stress relief structure 108 to anchors 130 in a drive mode (e.g., motion along the x-axis) and sense mode (e.g., motion along the y-axis). In some embodiments, the frame 140 of the stress relief structure 108, including the U-shaped beams 134 and L-shaped beams 132, are made of silicon. As described herein, the U-shaped beams 134 may provide stress relief for the MEMS device 100. The L-shaped beams 132 may provide stress relief for the MEMS device 100 and may additionally ensure there is no inadvertent tilting of the drive structure 104 and stress relief structure 108.

At least one U-shaped beam 134 may be provided being coupled to an L-shaped beam 132 of the frame 140. For example, the frame comprises four U-shaped beams 134 in the illustrated embodiment. A respective one of the plurality of U-shaped beams 134 is coupled to a respective one of the plurality L-shaped beams 132 such that the frame 140 comprises a U-shaped beam 134 and a L-shaped beam 132 in each of the four corners of the frame 140.

Each U-shaped beam 134 may comprise two legs 146, 148 coupled together by a spacer 147. The legs 146, 148 may be substantially parallel to each other. The spacer 147 may separate a first leg 146 from a second leg 148 of the U-shaped beam 134 along a horizontal axis (e.g., an x-axis). Each of the legs 146, 148 may have a largest dimension along a vertical axis (e.g., a y-axis) substantially perpendicular to the horizontal axis. In the illustrated embodiment, the first leg 146 is longer than the second leg 148. In other embodiments, the first and second legs 146, 148 may have a same length.

As described herein, a U-shaped beam 134 may be coupled to an L-shaped beam 132. As shown in FIG. 3, the U-shaped beam 134 is coupled to the vertex 142 of the L-shaped beam 132, where legs 141 of the L-shaped beam 132 are coupled together.

In some embodiments, one of more of the U-shaped beams 134 may be coupled to each other. For example, as shown in FIG. 3, a coupler 150 is provided for coupling two U-shaped beams 134 together (via legs 146 of the respective U-shaped beams 134). Frame 140 comprises two couplers 150 for coupling adjacent pairs of U-shaped beams 134 together.

At least one of the plurality of U-shaped beams 134 may be coupled to an anchor 130 via a spring 124. As shown in the illustrated embodiment, the anchor 130 is disposed substantially outside of the frame 140 and outside of the drive structure 104. Springs 124 may be provided for coupling the U-shaped beams 134 of the frame 140 of the stress relief structure 108 to the anchors 130.

As shown in the illustrated embodiments, the stress relief structure 108 is symmetric. For example, the stress relief structure 108, including frame 140, exhibits in-plane (e.g., x-y plane) rotational symmetry. In particular, the stress relief structure 108 has second order rotational symmetry. For example, the configuration of the stress relief structure 108 appears identically when the stress relief structure 108 is rotated by 180 degrees.

FIG. 4 illustrates a portion of the example MEMS device 100 of FIG. 1 illustrating the example stress relief structure 108 of FIG. 3 being coupled to a drive structure 104 of the MEMS device 100, according to some non-limiting embodiments. In particular, FIG. 4 illustrates the stress relief structure 108 of FIG. 3 implemented as part of MEMS device 100. As shown in FIG. 4, the drive structure 104 is disposed substantially within the frame 140 of the stress relief structure 108. Although FIG. 4 illustrates only a single stress relief structure 108 and a single drive structure 104, it should be understood that one or more additional stress relief structures may be implemented, for example, being coupled to a second drive structure of the MEMS device 100 or to one or more sense structures of the MEMS device 100 as shown in FIG. 5.

FIG. 5 illustrates an enlarged portion of the example MEMS device 100 of FIG. 1 illustrating the example stress relief structure 108 of FIG. 3 being coupled to a sense structure 106 of the MEMS device 100, according to some non-limiting embodiments. As shown in FIG. 5, the sense structure 106 is disposed substantially within the frame 140 of the stress relief structure 108. In some embodiments, both of a drive structure 104 and a sense structure 106 may be coupled to a respective stress relief structure 106. In some embodiments, for example, as shown in FIG. 1A, the MEMS device 100 may comprise a respective stress relief structure 108 coupled to each drive structure 104 and each sense structure 106. Although FIG. 5 illustrates only a single stress relief structure 108 and a single sense structure 106, it should be understood that one or more additional stress relief structures may be implemented, for example, being coupled to a second sense structure of the MEMS device 100.

Figure 6:
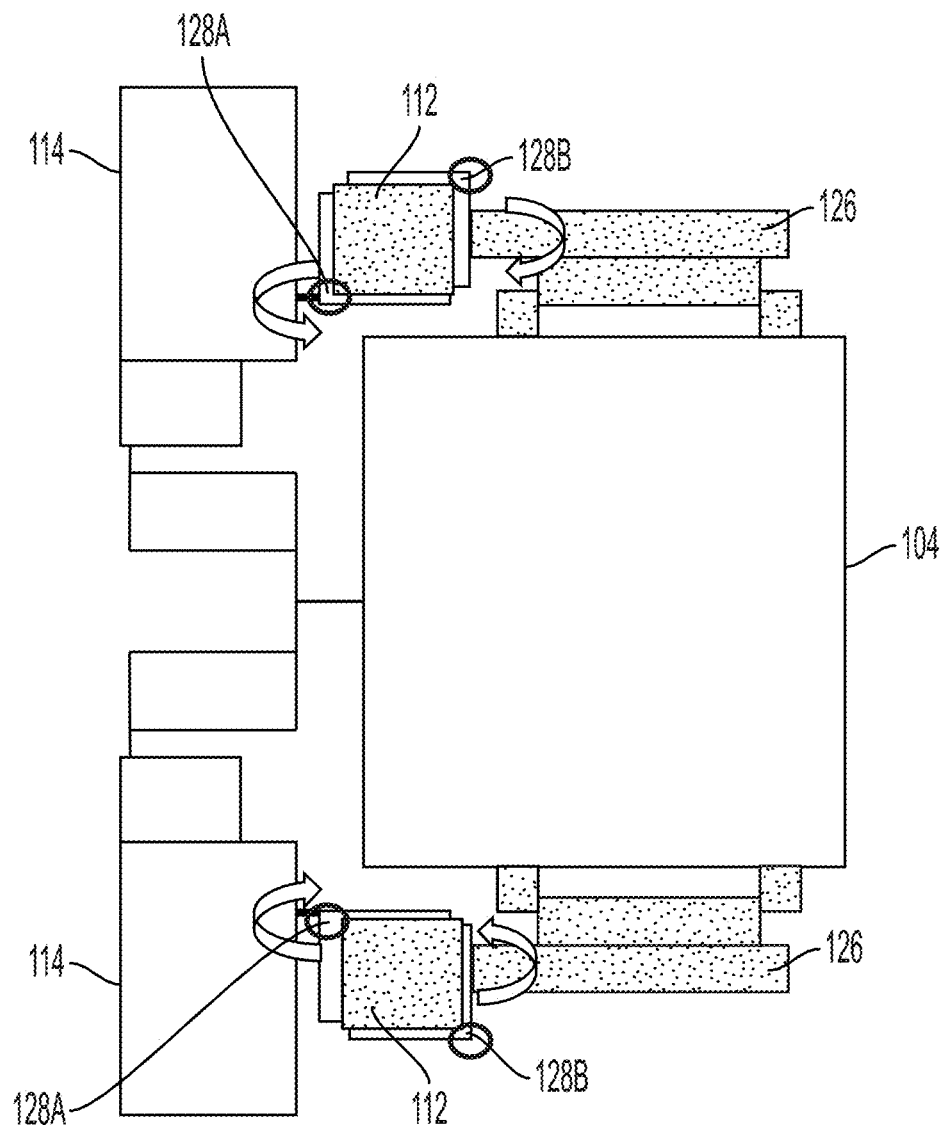
FIG. 6 is a schematic diagram illustrating aspects of the example MEMS device of FIG. 1 when in motion, according to some non-limiting embodiments.

FIG. 6 is a schematic diagram illustrating aspects of the example MEMS device 100 of FIG. 1 when in motion, according to some non-limiting embodiments. In particular, FIG. 6 illustrates two pivot points 128A, 128B of the MEMS device 100. The pivots points 128A, 128B are disposed on opposing diagonals of the anchor 112. Accordingly, the MEMS device 100 may be configured to pivot about anchor 112 at pivot points 128A, 128B.

One or more of pivot points 128A, 128B may be static stress relief pivot points that act as a stress relief mechanism for the static stress deformations resulting from environmental and package stresses. It should be appreciated that any number of static stress relief pivot points may be implemented. For example, in some embodiments, the MEMS device 100 may comprise a single static stress relief pivot point about anchor 112. In the illustrated embodiment, pivot point 128B serves as a static stress relief pivot point. In some embodiments, one or more additional pivot points may be provided for static stress relief.

In some embodiments, one or more of pivot points 128A, 128B may serve as dynamic pivot points, for example, to facilitate a drive mode of the MEMS device 100. In particular, pivot point 128A is disposed at the point where the lever 114 is coupled to the anchor 112. During drive and sense modes of operation, as shown in FIGS. 1B-1C, levers 114 may pivot about pivot point 128A. Accordingly, pivot point may be referred to as a dynamic pivot as it facilitates the motion of the levers 114 in drive and sense modes of the MEMS device 100.

As shown in FIG. 6, two anchors 112 may be coupled to drive structure via arms 126. In some embodiments, such as the embodiment illustrated in FIG. 6, there may be multiple pivot points 128A, 128B about each of the anchors 112.

Figure 7A:
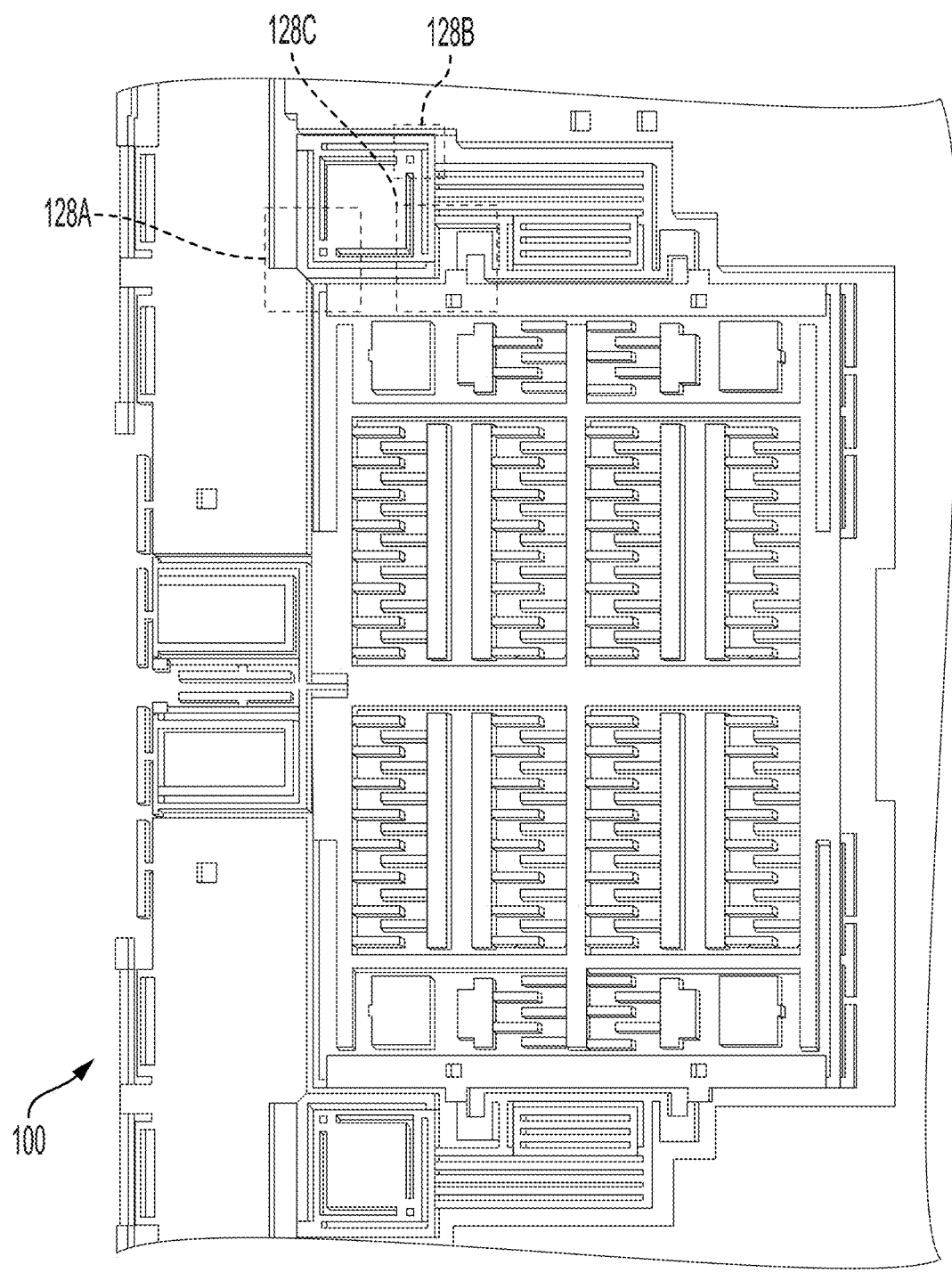
FIGS. 7A-7B are enlarged views of the example MEMS device of FIG. 1 illustrating mechanically aspects of the schematic diagram of FIG. 6, according to some non-limiting embodiments.
Figure 7B:
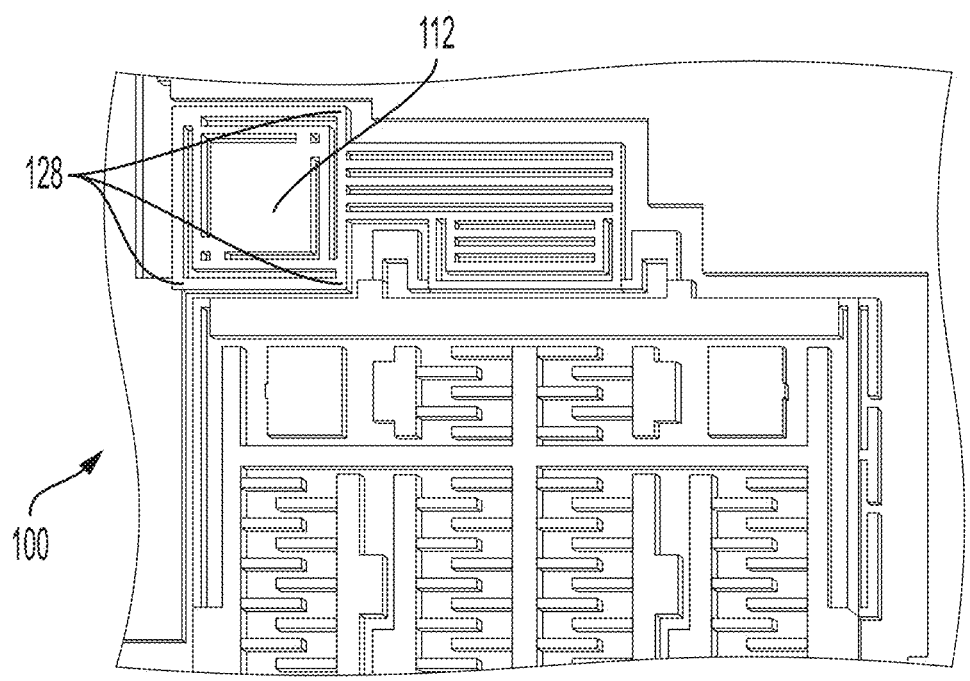

FIGS. 7A-7B are enlarged views of the example MEMS device 100 of FIG. 1 illustrating mechanically aspects of the schematic diagram of FIG. 6, according to some non-limiting embodiments. As shown in FIG. 7A, dynamic pivot point 128A is provided where lever 114 is coupled to anchor 112. Static stress relief pivot point 128B is also provided. As shown in FIG. 7A, the static stress relief pivot point 128B is disposed diagonally opposite pivot point 128A. An additional pivot point 128C is provided about anchor 112. Pivot point 128C may be a static stress relief pivot point.

FIG. 7B illustrates an enlarged view of the portion of the example MEMS device 100 shown in FIG. 7A, according to some non-limiting embodiments. FIG. 7B depicts pivot points 128 disposed about anchor 112, as described herein.

The inventors have recognized that configuring the anchors of the MEMS device with at least two pivot points may significantly reduce quadrature experienced by the MEMS device which would otherwise result from diagonal rotation of the drive and sense structures by releasing stress of the MEMS device.

Figure 8:
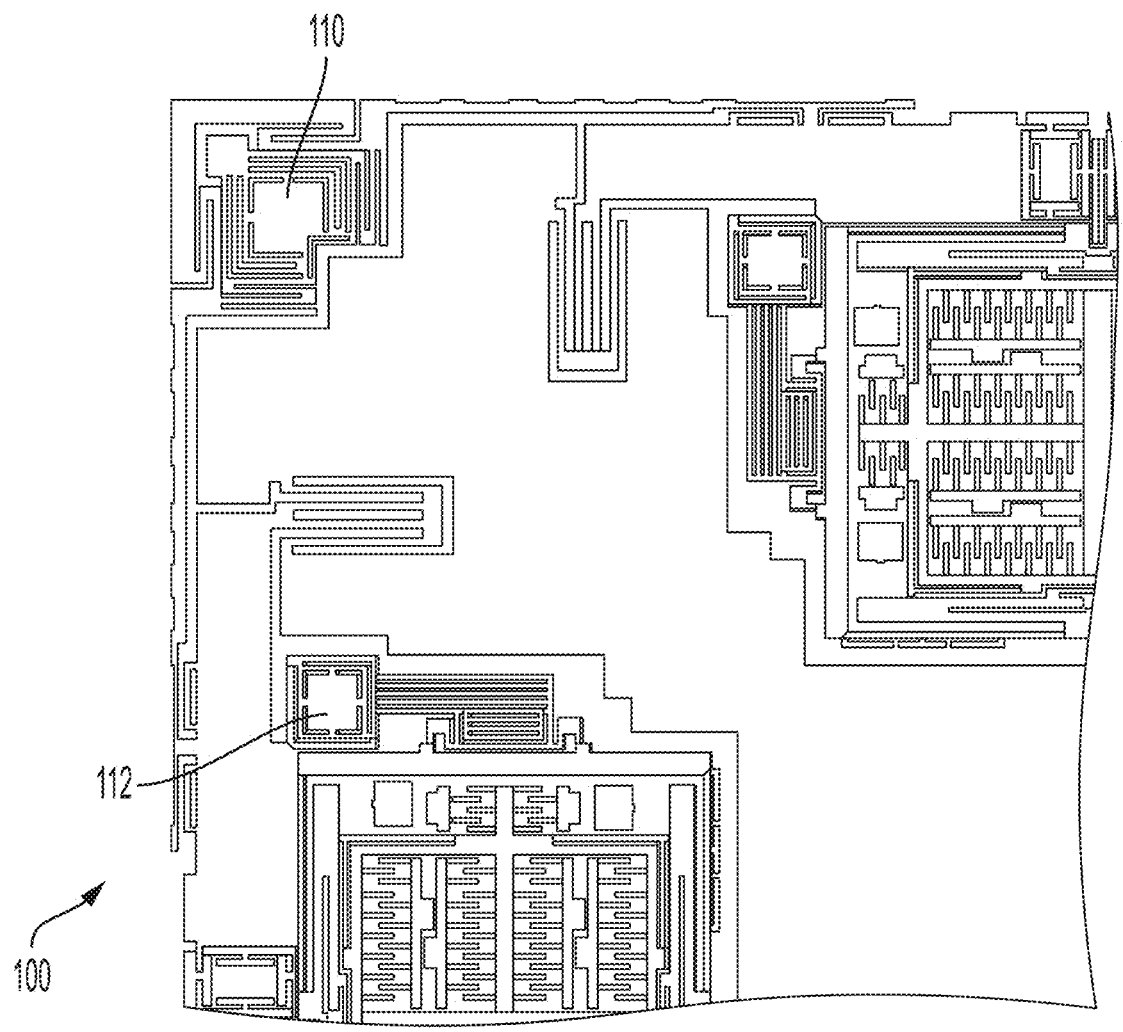
FIG. 8 is an enlarged view of the example MEMS device of FIG. 1 illustrating symmetric anchor connections, according to some non-limiting embodiments.

FIGS. 8-10B illustrate aspects of the MEMS device relating to symmetric anchor connections. FIG. 8 is an enlarged view of the example MEMS device 100 of FIG. 1 illustrating symmetric anchor connections, according to some non-limiting embodiments. As described herein, the MEMS device 100 may comprise a plurality of anchors for coupling components (e.g., the proof mass 102) of the MEMS device 100 to an underlying substrate. FIG. 8 illustrates anchor 112, which, as described herein, may be coupled to levers 114 as well as to a drive or sense structure (e.g., via stress relief structure 108). Although only a single anchor 112 is shown and labeled in FIG. 8, the MEMS device 100 may include a plurality of anchors configured in the same manner as anchor 112 (e.g., being coupled to a lever 114 and stress relief structure 108 and having the symmetric anchor connections described herein).

FIG. 8 further illustrates anchor 110. Anchor 110 may be coupled to an outer frame of the MEMS device 100, as is further described herein, for example, with respect to FIGS. 10A-10B. Although only a single anchor 110 is shown and labeled in FIG. 8, the MEMS device 100 may include a plurality of anchors configured in the same manner as anchor 112 (e.g., being coupled to an outer frame of the MEMS device 100 and having the symmetric anchor connections described herein). The inventors have recognized that implementing multiple anchor connections which may be disposed symmetrically about an anchor in a MEMS device may improve the symmetry of the MEMS device, thereby reducing non-linearity and quadrature.

Figure 9A:
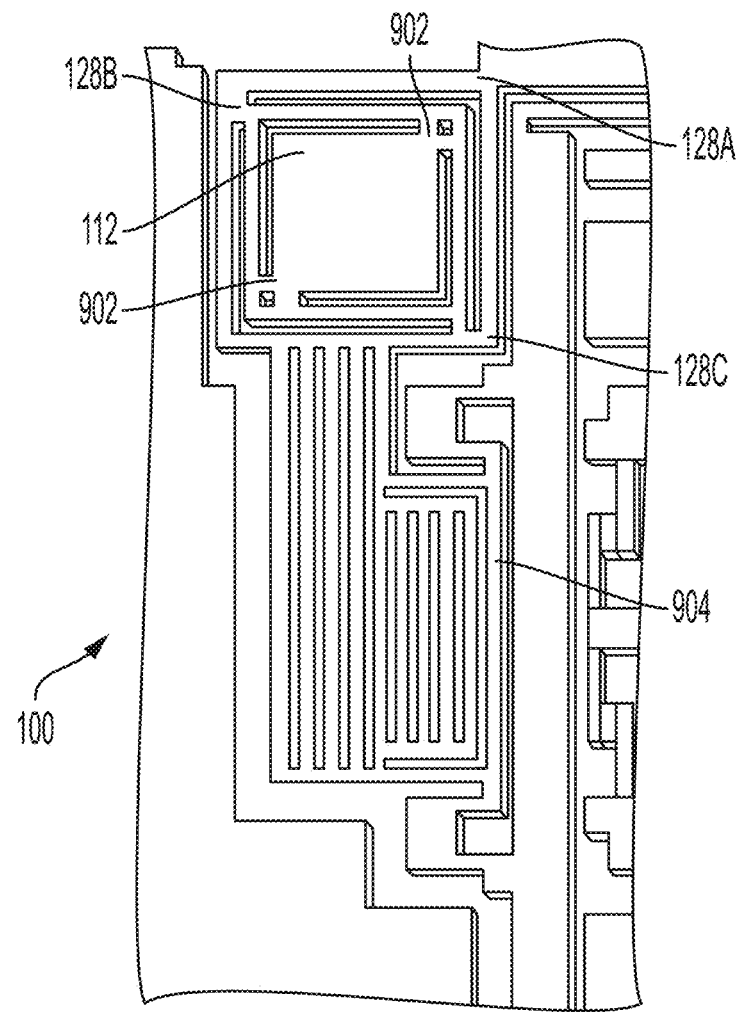
FIG. 9A illustrates aspects of diagonal anchor connections of the example MEMS device of FIG. 1, according to some non-limiting embodiments.

FIG. 9A illustrates an embodiment of the MEMS device having two anchor connections to an anchor 112 of the MEMS device 100 which is coupled to a drive structure (e.g., via stress relief structure 108). For example, in the illustrated embodiment of FIG. 9A, the anchor connections 902 are coupled to opposite diagonals of the anchor 112. Anchor connections 902 may be flexible in some embodiments, e.g., comprising springs. In some embodiments, anchor connections 902 may not be flexible.

FIG. 9A further illustrates pivot points 128A-C. As described herein, one or more of pivot points 128B-128C may be static stress relief pivot points for relieving the static stress deformations resulting from environmental and package stresses. Pivot point 128A may serve as a dynamic pivot point.

Figure 9B:
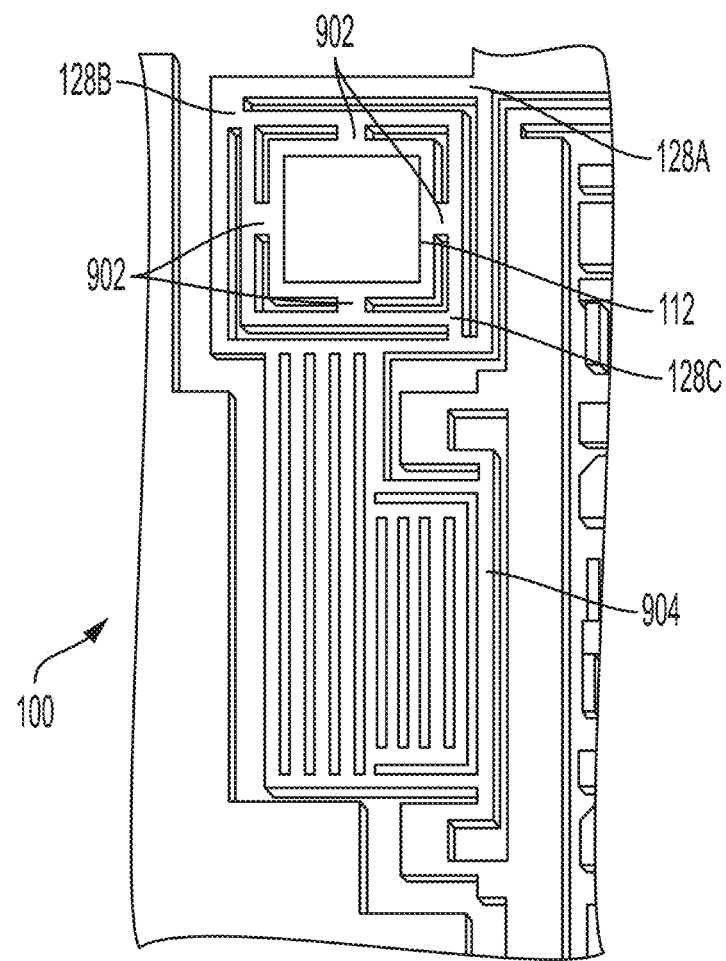
FIG. 9B illustrates aspects of symmetric anchor connections of the example MEMS device of FIG. 1, according to some non-limiting embodiments.

FIG. 9B illustrates an embodiment of the MEMS device 100 having four anchor connections 902 to an anchor 112 of the MEMS device 100 which is coupled to a drive structure 104 (e.g., via stress relief structure 108). For example, in the illustrated embodiment of FIG. 9B, each respective one the four anchor connections 902 is coupled to a respective side of the anchor 112.

In both FIGS. 9A-9B, the anchor connections 902 are coupled to the drive structure 104 (e.g., through the stress relief structure 108) with a drive-anchor connector 904. Drive anchor connector 904 may be coupled to the anchor connections 902 through the static stress relief pivots 128B, 128C that act as a stress relief structure for the static stress deformations resulting from environmental and package stresses. Drive-anchor connector 904 may comprise arm 126 previously described herein. In some embodiments, drive-anchor connector 904 is coupled to the drive structure 104 (e.g., via stress relief structure 108) by one or more springs (e.g., folded springs, as shown in the illustrated embodiment). In some embodiments, a lever 114 may be coupled to the anchor connections 902 at the pivot point 128A that acts as a dynamic AC pivot during the drive and sense modes of the MEMS device 100 as shown in FIGS. 1B-1C.

Figure 10A:
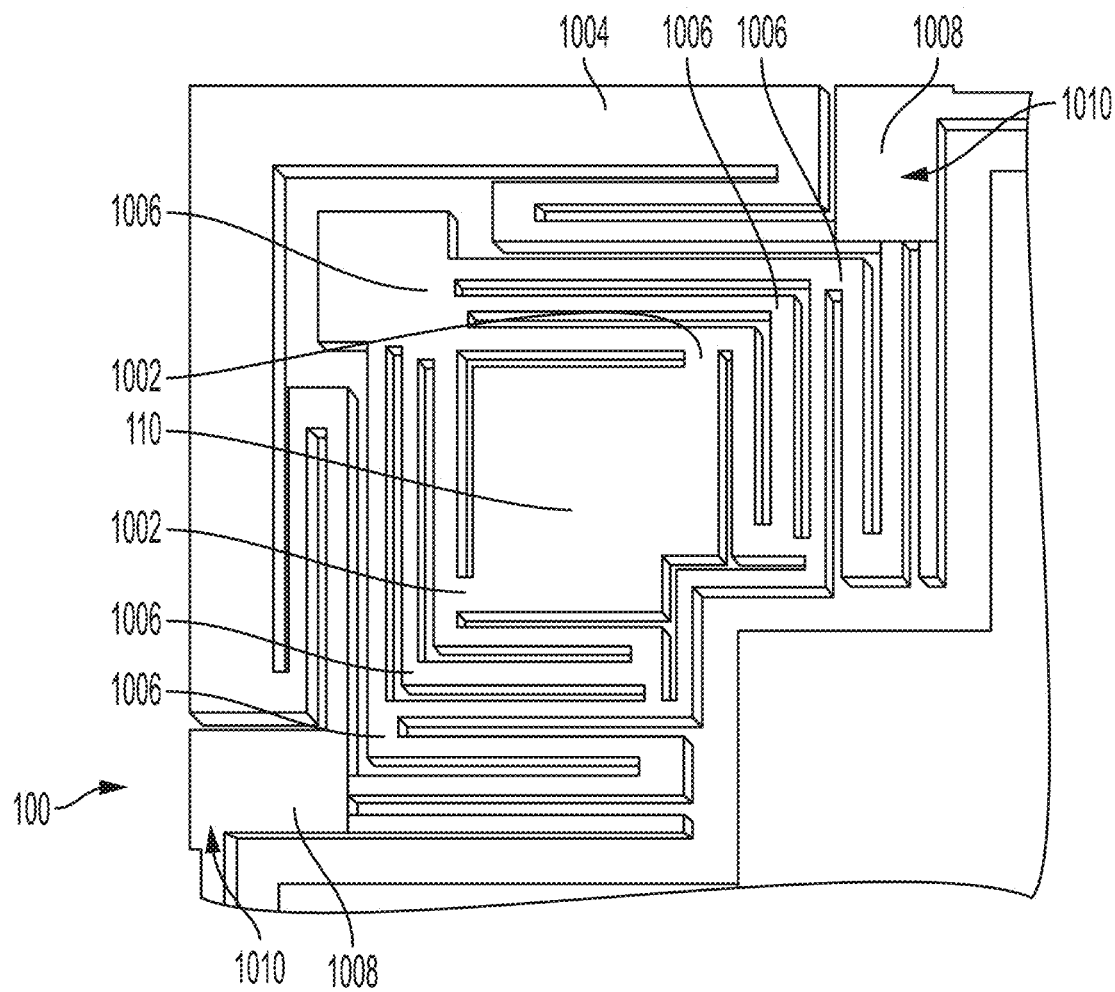
FIG. 10A illustrates aspects of diagonal anchor connections of the example MEMS device of FIG. 1, according to some non-limiting embodiments.
Figure 10B:
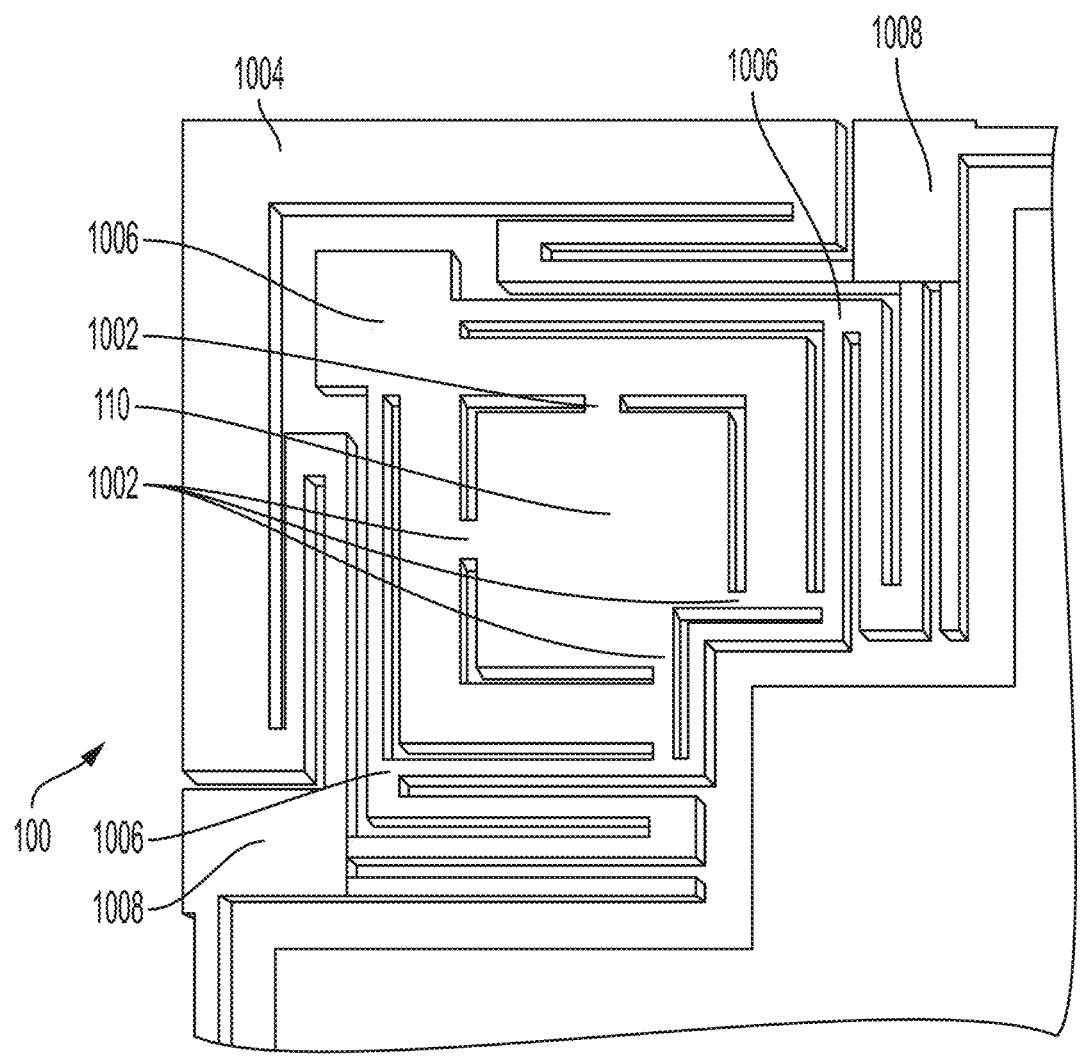
FIG. 10B illustrates aspects of symmetric anchor connections of the example MEMS device of FIG. 1, according to some non-limiting embodiments.

FIG. 10A illustrates an embodiment of the MEMS device 100 having two anchor connections 1002 to an anchor 110 of the MEMS device 100 which is coupled to an outer frame 1004 of the MEMS device 100. As described herein, MEMS device 100 may comprise an outer frame 1004 wherein the proof mass 102 is disposed substantially within the outer frame 1004. As shown in FIGS. 10A-10B, anchor 110 may be coupled to the outer frame 1004 of the MEMS device 100 via a plurality of connections 1002.

In the illustrated embodiment of FIG. 10A, the anchor connections 1002 are coupled to opposite diagonals of the anchor 110. In the illustrated embodiments of FIG. 10B, the MEMS device 100 comprises four anchor connections to anchor 110. In the illustrated embodiment of FIG. 10B, each respective one of the four anchor connections 1002 may be coupled to a respective side of the anchor 110.

Anchor connections 1002 may be flexible in some embodiments, e.g., comprising springs. In some embodiments, anchor connections 1002 may not be flexible.

In both FIGS. 10A-10B, the anchor connections 1002 are coupled to the outer frame 1004 via couplers 1010. The MEMS device 100 may comprise dynamic AC pivot points 1008 joining the anchor connections 1002 to the couplers 1010 and to the outer frame 1004. As described herein, dynamic pivot points may facilitate motion of components of the MEMS device 100 (e.g., the outer frame 1004) during drive and sense modes as shown in FIGS. 1B-1C. MEMS device 100 may further comprise a plurality of static stress relief pivot points 1006. As described herein, static stress relief pivot points act as a stress relief structure for the static stress deformations of the MEMS device 100 resulting from environmental and package stresses.

As described herein, the stress relief structures and related aspects may be implemented in a MEMS gyroscope (e.g., a MEMS gyroscope configured to sense roll, pitch and/or yaw rotation). MEMS device 100 may form a portion of a larger MEMS device. FIG. 11A illustrates an example MEMS gyroscope 1100 having four proof masses 1102, according to some non-limiting embodiments. In some embodiments, the MEMS 1100 gyroscope of FIG. 11A may be configured to sense rotation about two or more axes. The MEMS gyroscope 1100 shown in FIG. 11A comprises four quadrants 1104 coupled together and arranged in a 2×2 formation. Each quadrant of the MEMS gyroscope 1100 of FIG. 11A may have a proof mass 1102 and the stress relief structures and related mechanisms described herein (e.g., having additional pivot points and/or symmetric anchor connections coupling respective frames of drive and/or sense structures to an anchor). For example, each quadrant 1104 may be configured with some or all of the features of MEMS device 100.

The proof masses 1102 in the respective quadrants may be configured to move anti-phase relative to an adjacent proof mass 1102. That is, a proof mass 1102 may be configured to move in an opposite direction along a first axis in a drive mode relative to the motion of proof masses vertically and horizontally adjacent to the proof mass 1102, and in a same direction along the first axis relative to motion of a proof mass diagonally adjacent to the proof mass 1102. In a sense mode, the proof mass 1102 may be configured to move in an opposite direction along a second axis substantially perpendicular to the first axis relative to motion of the proof masses vertically and horizontally adjacent to the proof mass 1102, and in a same direction along the second axis relative to the motion of a proof mass diagonally adjacent to the proof mass 1102.

FIG. 11B illustrates an example MEMS gyroscope 1110 having twelve proof masses, according to some non-limiting embodiments. In particular, FIG. 11B illustrates an example of a MEMS gyroscope 1110 having three columns 1120A, 1120B, 1120C, each column being configured to sense rotation about a respective axis (e.g., pitch, roll, or yaw rotation). In some embodiments, the MEMS gyroscope 1110 may be configured having two columns, with one or more columns being configured to sense rotation about multiple axes (e.g., one or more of pitch, roll, and/or yaw rotation). Each column may comprise at least three proof masses 1102, with the MEMS gyroscope 1110 of the illustrated embodiment having four proof masses per column. The MEMS gyroscope 1110 of FIG. 11B may be implemented having the stress relief structures and related mechanisms described herein (e.g., having additional pivot points and/or symmetric anchor connections coupling respective frames of drive and/or sense structures to an anchor). For example, in some embodiments, the MEMS gyroscope 1110 of FIG. 11B may implement the stress relief structures and related mechanisms described herein in one or more of the columns of the MEMS gyroscope 1110 (e.g., in a column of the MEMS gyroscope 1110 configured to sense yaw rotation).

As described herein, MEMS devices having stress relief structures and additional aspects of stress relief of the types described herein may be deployed in various settings to detect angular rates, including sports, healthcare, military, and industrial applications, among others. A MEMS device (e.g., a MEMS inertial sensor such as a MEMS gyroscope, for example) may be mounted as a wearable sensor deployed in monitoring sports-related physical activity and performance, patient health, military personnel activity, or other applications of interest of a user. A MEMS gyroscope may be disposed in a smartphone, and may be configured to sense roll, pitch and/or yaw angular rates.

Figure 12:
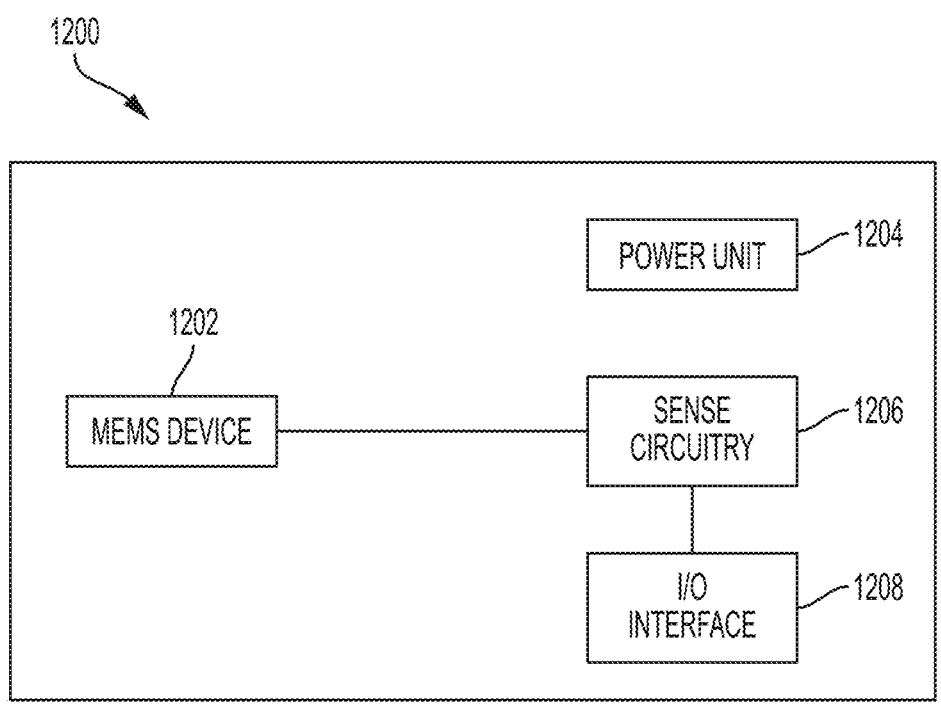
FIG. 12 is a block diagram illustrating an example system including a MEMS gyroscope, according to some non-limiting embodiments.

FIG. 12 is a block diagram illustrating a system 1200 comprising a MEMS device 1202, a power unit 1204, sense circuitry 1206 and input/output (I/O) interface 1208. MEMS device 1202 may comprise any one or a combination of the MEMS devices described herein. In some embodiments, the MEMS device(s) may comprise a MEMS gyroscope configured to sense roll, pitch and/or yaw angular rates.

System 1200 may periodically transmit, via wired connections or wirelessly, data representing sensed angular rates to an external monitoring system, such as a computer, a smartphone, a tablet, a smartwatch, smartglasses, or any other suitable receiving device. I/O interface 1208 may be configured to transmit and/or receive data via Wi-Fi, Bluetooth, Bluetooth Low Energy (BLE), Zigbee, Thread, ANT, ANT+, IEEE 1202.15.4, IEEE 1202.11.ah, or any other suitable wireless communication protocol. Alternatively, or additionally, I/O interface 1208 may be configured to transmit and/or receive data using proprietary connectivity protocols. I/O interface 1208 may comprise one or more antennas, such as a microstrip antenna. In some embodiments, I/O interface 1208 may be connected to a cable, and may be configured to transmit and/or receive signals through the cable.

System 1200 may be powered using power unit 1204. Power unit 1204 may be configured to power some or all of sense circuitry 1206, I/O interface 1208, and/or MEMS device 1202. In some embodiments, power unit 1204 may comprise one or more batteries. System 1200 may, in at least some embodiments, consume sufficiently little power to allow for its operation for extended periods based solely on battery power. The battery or batteries may be rechargeable in some embodiments. Power unit 1204 may comprise one or more lithium-ion batteries, lithium polymer (LiPo) batteries, super-capacitor-based batteries, alkaline batteries, aluminum-ion batteries, mercury batteries, dry-cell batteries, zinc-carbon batteries, nickel-cadmium batteries, graphene batteries or any other suitable type of battery. In some embodiments, power unit 1204 may comprise circuitry to convert AC power to DC power. For example, power unit 1204 may receive AC power from a power source external to system 1200, such as via I/O interface 1208, and may provide DC power to some or all the components of system 1200. In such instances, power unit 1204 may comprise a rectifier, a voltage regulator, a DC-DC converter, or any other suitable apparatus for power conversion.

Power unit 1204 may comprise energy harvesting components and/or energy storage components, in some embodiments. Energy may be harvested from the surrounding environment and stored for powering the system 1200 when needed, which may include periodic, random, or continuous powering. The type of energy harvesting components implemented may be selected based on the anticipated environment of the system 1200, for example based on the expected magnitude and frequency of motion the system 1200 is likely to experience, the amount of stress the system is likely to experience, the amount of light exposure the system is likely to experience, and/or the temperature(s) to which the system is likely to be exposed, among other possible considerations. Examples of suitable energy harvesting technologies include thermoelectric energy harvesting, magnetic vibrational harvesting, electrical overstress harvesting, photovoltaic harvesting, radio frequency harvesting, and kinetic energy harvesting. The energy storage components may comprise supercapacitors in some embodiments.

Figure 13:
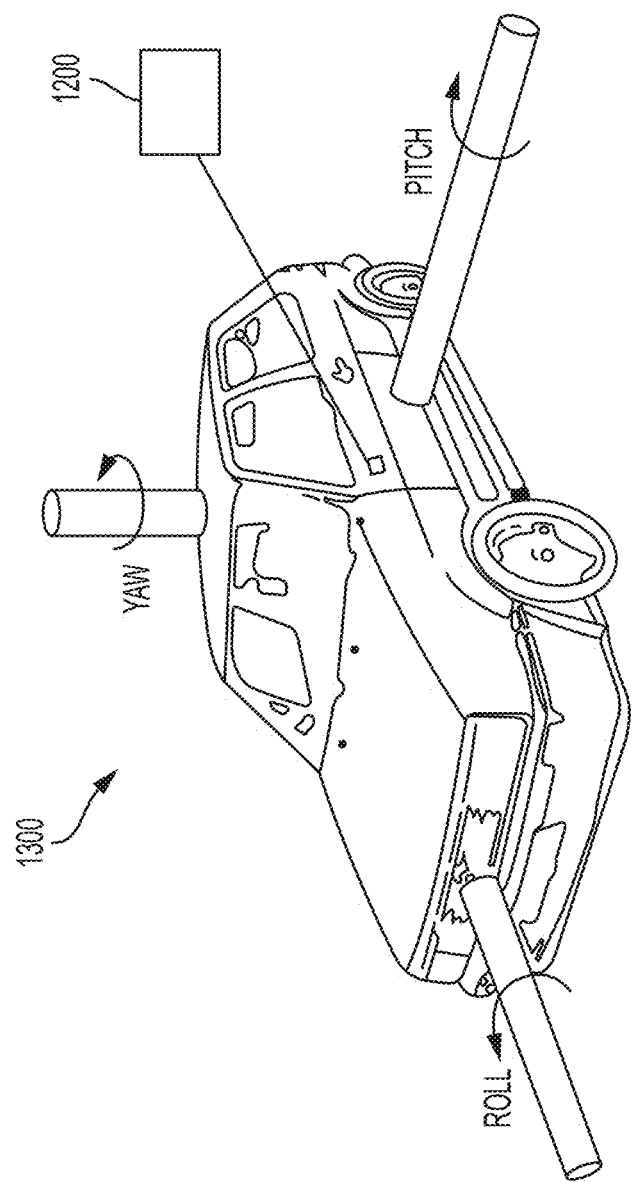
FIG. 13 is a perspective view illustrating an automobile including an example system having a MEMS gyroscope, according to some non-limiting embodiments.

As described above, MEMS devices of the types described herein may be deployed in various settings, for example, to detect angular rates. One such setting is in automobiles, or other vehicles, such as boats or aircrafts. FIG. 13 illustrates schematically an automobile 1300 comprising a system 1200, according to some non-limiting embodiments. System 1200 may be disposed in any suitable location of automobile 1300. In some embodiments, the system 1200 may comprise a package or housing attached to a suitable part of the automobile 1300, with the MEMS device inside. In some embodiments, system 1200 may be configured to sense roll, pitch and/or yaw angular rates. System 1200 may be configured to provide, using I/O interface 1208, sensed angular rates to a computer system disposed in automobile 1300 and/or to a computer system disposed on a base station outside automobile 1300.

Another setting in which MEMS devices having stress relief aspects of the types described herein may be used is in sensor devices for sports applications, such as tennis, swimming, running, baseball, or hockey, among other possibilities. In some embodiments, a MEMS device of the types described herein may be a wearable fitness device. In other embodiments, the sensor may be part of a piece of sporting equipment, such as being part of a tennis racket, baseball bat, or hockey stick. Sense data from the sensor may be used to assess performance of the user.

Aspects of the technology described herein may provide one or more benefits, some of which have been previously described. Aspects of the technology described herein provide an improved stress relief structure and other aspects for improving stress relief of a MEMS device, such as a MEMS gyroscope. It should be appreciated that not all aspects and embodiments necessarily provide all of the benefits described herein. Further, it should be appreciated that aspects of the technology described herein may provide additional benefits to those described herein.

The expressions "substantially in a direction" and "substantially parallel to a direction" should be interpreted herein as parallel to the direction or angled with respect to the direction by less than 20°, including any value within that range.

The terms "approximately" and "about" may be used to mean±20% of a target value in some embodiments, within ±10% of a target value in some embodiments, within ±5% of a target value in some embodiments, and yet within ±2% of a target value in some embodiments. The terms "approximately" and "about" may include the target value.

What is claimed is:

1. A microelectromechanical systems (MEMS) device comprising:
   a mass configured to move along a first axis and a second axis substantially perpendicular to the first axis;
   a movable drive structure coupled to the mass and configured to move along the first axis, wherein movement of the drive structure along the first axis causes movement of the mass along the first axis; and
   a stress relief structure comprising a frame coupled to the movable drive structure, wherein the frame comprises:
      a plurality of L-shaped beams including a first L-shaped beam coupled to the movable drive structure at at least one first point and a second L-shaped beam coupled to the movable drive structure at at least one second point; and
      a plurality of U-shaped beams including a first U-shaped beam coupled to a vertex of the first L-shaped beam and a second U-shaped beam coupled to a vertex of the second L-shaped beam.

2. The MEMS device of claim 1, wherein the movable drive structure is disposed substantially within the frame of the stress relief structure.

3. The MEMS device of claim 1, wherein the at least one first point comprises multiple points and the at least one second point comprises multiple points.

4. The MEMS device of claim 2, wherein the first and second U-shaped beams are coupled together.

5. The MEMS device of claim 1, wherein the stress relief structure is coupled to one or more anchors disposed outside of the frame of the stress relief structure.

6. The MEMS device of claim 1, further comprising:
   a movable sense structure coupled to the mass and configured to detect motion of the mass along the second axis, wherein movement of the mass along the second axis causes movement of the movable sense structure along the second axis; and
   a second stress relief structure coupled to the movable sense structure.

7. The MEMS device of claim 6, further comprising:
   a second movable drive structure coupled to the mass and configured to cause the mass to move along the first axis;
   a second movable sense structure coupled to the mass and configured to detect motion of the mass along the second axis;
   a third stress relief structure coupled to the second movable drive structure;
   and a fourth stress relief structure coupled to the second movable sense structure.

8. The MEMS device of claim 1, further comprising:
   a pair of levers coupling the movable drive structure to the mass, wherein each lever of the pair of levers comprises a box spring.

9. A microelectromechanical systems (MEMS) device comprising:
   a mass configured to move along a first axis and a second axis substantially perpendicular to the first axis;
   a movable drive structure coupled to the mass and configured to move along the first axis, wherein movement of the movable drive structure along the first axis causes movement of the mass along the first axis;
   a movable sense structure coupled to the mass and configured to detect motion of the mass along the second axis, wherein movement of the mass along the second axis causes movement of the movable sense structure along the second axis;
   a stress relief structure coupled to one of the movable drive structure or the movable sense structure; and
   at least one anchor coupled to an underlying substrate of the MEMS device, wherein the stress relief structure is coupled to the at least one anchor and the at least one anchor is disposed outside of the stress relief structure.

10. The MEMS device of claim 9, wherein the MEMS device comprises at least two pivot points about the at least one anchor.

11. The MEMS device of claim 10, wherein the MEMS device comprises at least three pivot points about the at least one anchor.

12. The MEMS device of claim 9, wherein the MEMS device comprises a plurality of connections to the at least one anchor, the plurality of connections being disposed symmetrically about the at least one anchor.

13. The MEMS device of claim 12, wherein the plurality of connections comprise two connections disposed on opposing diagonals of the at least one anchor.

14. The MEMS device of claim 12, wherein the plurality of connections comprise four connections disposed on opposing sides of the at least one anchor.

15. The MEMS device of claim 9, further comprising a second anchor coupled to an outer frame of the MEMS device, the mass being disposed substantially within the outer frame, wherein MEMS device comprises at least two pivots about the second anchor.

16. The MEMS device of claim 15, wherein the MEMS device comprises at least three pivots about the second anchor.

17. The MEMS device of claim 9, wherein the stress relief structure comprises:
   an L-shaped beam coupled to the one of the movable drive structure or the movable sense structure; and
   a U-shaped beam coupled to a vertex of the L-shaped beam and the at least one anchor via a spring.

18. A microelectromechanical systems (MEMS) device comprising:
   a mass configured to move along a first axis and a second axis substantially perpendicular to the first axis;
   a movable sense structure coupled to the mass and configured to detect motion of the mass along the second axis, wherein movement of the mass along the second axis causes movement of the movable sense structure along the second axis;

a stress relief structure coupled to the movable sense structure, the stress relief structure comprising:

a frame comprising:
- a plurality of L-shaped beams including a first L-shaped beam and a second L-shaped beam; and
- a plurality of U-shaped beams including a first U-shaped beam coupled to a vertex of the first L-shaped beam and a second U-shaped beam coupled to a vertex of the second L-shaped beam, wherein the frame exhibits rotational symmetry within an x-y plane.

19. The MEMS device of claim 18, wherein:

the plurality of U-shaped beams further comprises a third U-shaped beam coupled to a vertex of a third L-shaped beam of the plurality of L-shaped beams and a fourth U-shaped beam coupled to a vertex of a fourth L-shaped beam of the plurality of L-shaped beams;

the third U-shaped beam is coupled to the first U-shaped beam; and the fourth U-shaped beam is coupled to the second U-shaped beam.

20. The MEMS device of claim 18, further comprising one or more springs for coupling to one or more anchors disposed external to the stress relief structure.

* * * * *